US012323102B2

(12) United States Patent
Dodangeh et al.

(10) Patent No.: US 12,323,102 B2
(45) Date of Patent: Jun. 3, 2025

(54) APPARATUS COMPRISING A LOCAL OSCILLATOR FOR DRIVING A MIXER

(71) Applicant: Dialog Semiconductor B.V., 's-Hertogenbosch (NL)

(72) Inventors: Maryam Dodangeh, Hengelo (NL); Mark Oude Alink, Delden (NL); Bram Nauta, Borne (NL)

(73) Assignee: Renesas Design Netherlands B.V., 's-Hertogenbosch (NL)

( * ) Notice: Subject to any disclaimer, the term of this patent is extended or adjusted under 35 U.S.C. 154(b) by 111 days.

(21) Appl. No.: 17/980,847

(22) Filed: Nov. 4, 2022

(65) Prior Publication Data

US 2023/0155552 A1 May 18, 2023

(30) Foreign Application Priority Data

Nov. 12, 2021 (GB) ..................... 2116291

(51) Int. Cl.
| | | |
|---|---|---|
| *H03D 7/16* | (2006.01) | |
| *H03D 7/14* | (2006.01) | |
| *H03K 3/03* | (2006.01) | |
| *H03K 5/00* | (2006.01) | |

(Continued)

(52) U.S. Cl.
CPC ........... *H03D 7/168* (2013.01); *H03D 7/1475* (2013.01); *H03D 7/165* (2013.01); *H03K 3/0315* (2013.01); *H03K 3/0322* (2013.01); *H03K 5/00006* (2013.01); *H03K 5/133* (2013.01); *H04B 1/403* (2013.01)

(58) Field of Classification Search
CPC ...... H03D 7/168; H03D 7/1475; H03D 7/165; H04B 1/403; H03K 3/0322; H03K 5/00006; H03K 5/133; H03K 3/0315

USPC ........... 455/260, 255, 258, 265; 331/57, 25; 327/115, 117

See application file for complete search history.

(56) References Cited

U.S. PATENT DOCUMENTS

| | | | | |
|---|---|---|---|---|
| 5,180,994 A | * | 1/1993 | Martin | ................. H03K 3/0315 331/38 |
| 7,570,123 B2 | * | 8/2009 | Dent | ...................... H03L 7/093 331/16 |
| 2003/0137333 A1 | | 7/2003 | Kozaki | |

(Continued)

FOREIGN PATENT DOCUMENTS

JP 63246021 A 10/1988

OTHER PUBLICATIONS

UK Search Report, Application No. GB2116291.2, Reference No. P124001.GB.01, Mail date: Mar. 7, 2022, 3 pages.

(Continued)

*Primary Examiner* — Arnold M Kinkead
(74) *Attorney, Agent, or Firm* — Saile Ackerman LLC; Stephen B. Ackerman

(57) ABSTRACT

An apparatus comprising a local oscillator (LO) for driving a mixer, the LO being configured to oscillate at an oscillation frequency, and generate a first set of LO signals, wherein each of the first set of LO signals has a LO signal frequency equal to a first multiplication factor m multiplied by the oscillation frequency, the first multiplication factor m, being an integer greater than or equal to two, and each of the first set of LO signals is separated by adjacent LO signals by a phase difference equal to 360° divided by a first variable n, the first variable n being an integer that is greater than or equal to two.

22 Claims, 22 Drawing Sheets

(51) Int. Cl.
*H03K 5/133* (2014.01)
*H04B 1/403* (2015.01)

(56) References Cited

U.S. PATENT DOCUMENTS

2007/0001771 A1 1/2007 Hori et al.
2016/0198409 A1 7/2016 Chakraborty

OTHER PUBLICATIONS

"Mixing / Multiplication: Frequency Mixers," Understand RF Mixing & Frequency Mixers, Electronics Notes, Oct. 25, 2021, pp. 1-6, found: https://www.electronics-notes.com/articles/radio/rf-mixer/rf-mixing-basics.php.

"A 2.4 GHz Interferer-Resilient Wake-Up Receiver Using A Dual-IF Multi-Stage N-Path Architecture," by Camilo Salazar et al., IEEE Journal of Solid-State Circuits, vol. 51, No. 9, Sep. 2016, pp. 2091-2105.

"An Interference-Resilient BLE-Compatible Wake-Up Receiver Employing Single-Die Multi-Channel FBAR-Based Filtering and a 4-D Wake-Up Signature," by Po-Han Peter Wang et al., IEEE Journal of Solid-State Circuits, vol. 56, No. 2, Feb. 2021, pp. 416-426.

"A 4-Element Phased-Array System With Simultaneous Spatial- and Frequency-Domain Filtering at the Antenna Inputs," by Amir Ghaffari et al., IEEE Journal of Solid-State Circuits, vol. 49, No. 6, Jun. 2014, pp. 1303-1316.

"A Sub-100 µW MICS/ISM Band Transmitter Based on Injection-Locking and Frequency Multiplication," by Jagdish Pandey et al., IEEE Journal of Solid-State Circuits, vol. 46, No. 5, May 2011, pp. 1049-1058.

"A 220-µW—83-dBm 5.8-GHz Third-Harmonic Passive Mixer-First LP-WUR for IEEE 802.11ba," by Jaeho Im et al., IEEE Transactions on Microwave Theory and Techniques, vol. 67, No. 7, Jul. 2019, pp. 2537-2545.

\* cited by examiner

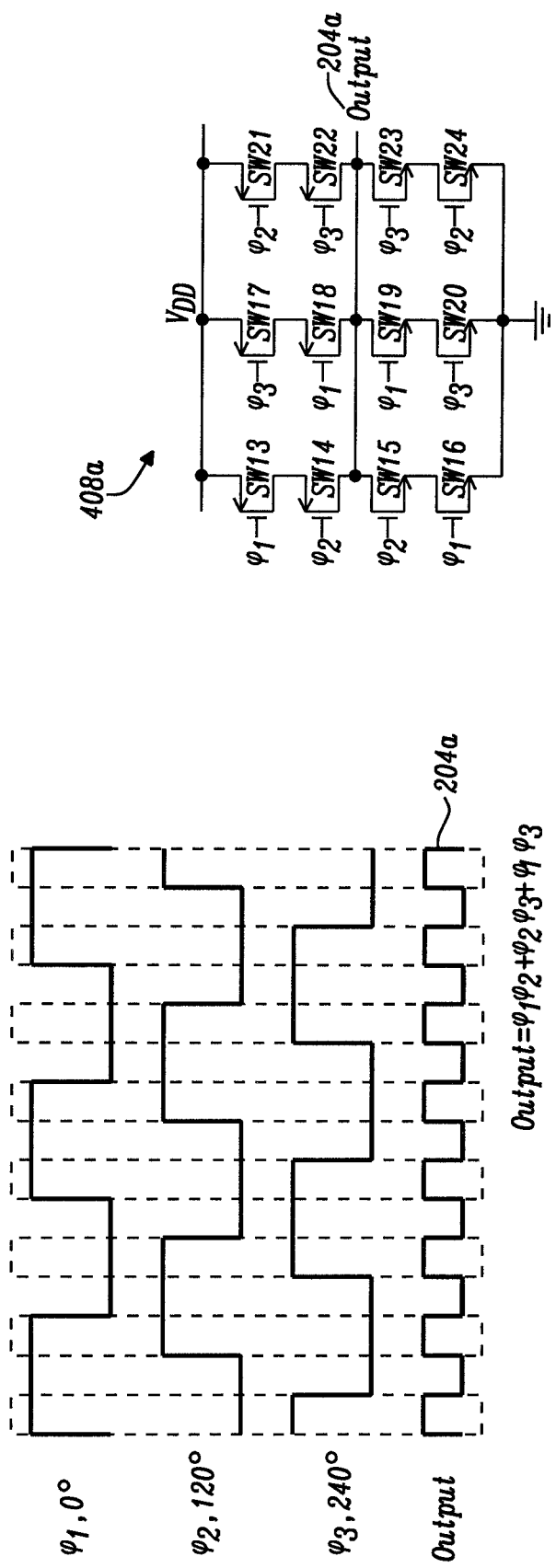

$\varphi_{out} = \varphi_1\varphi_4\varphi_5 + \varphi_1\varphi_2\varphi_5 + \varphi_1\varphi_2\varphi_3 + \varphi_2\varphi_3\varphi_4 + \varphi_3\varphi_4\varphi_5$

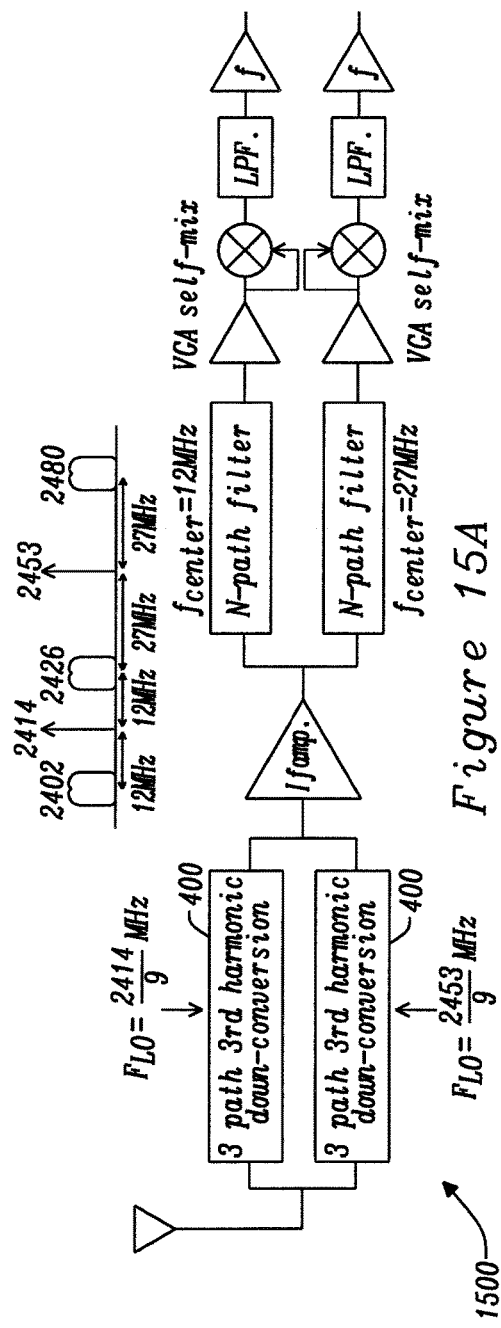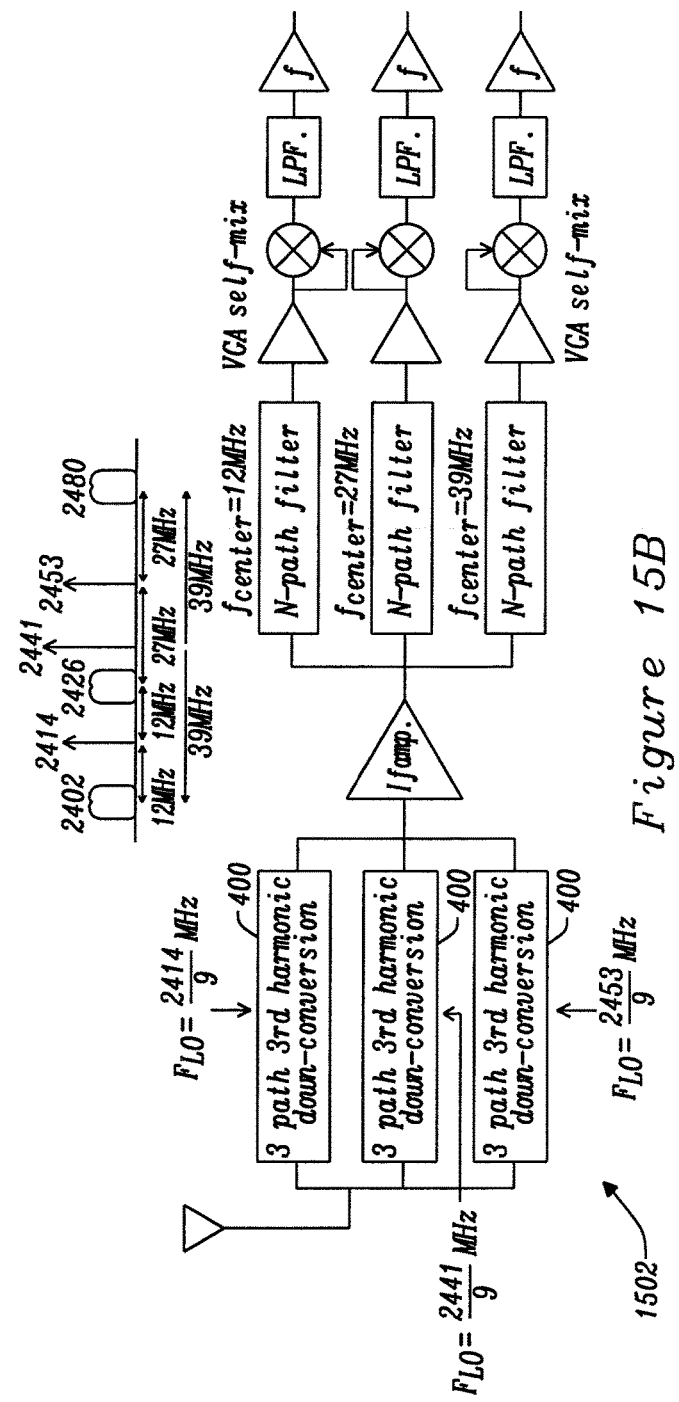

APPARATUS COMPRISING A LOCAL OSCILLATOR FOR DRIVING A MIXER

FIELD

The present disclosure relates to an apparatus comprising a local oscillator (LO) for driving a mixer.

BACKGROUND

A considerable amount of power can be consumed for generating local oscillator (LO) signals to drive the mixers for down-conversion in RF-receivers. Low power RF-receivers, such as regular Bluetooth Low Energy (BLE) or wake-up receivers, often report that more than 50% of the total power consumption is related to the local oscillator and its buffers.

Down-conversion is the process under which a radio frequency (RF) signal has its frequency reduced by providing the RF signal to a mixer along with an LO signal. The output signal, corresponding to the down-converted RF signal may be referred to as an intermediate frequency (IF) signal.

It will be appreciated that the process of up-conversion is the same as described for down-conversion other than the effect being the increasing of the frequency of the RF signal.

One known solution to reduce the power consumption of the local oscillator and its buffers is to use the higher harmonics of the LO signal for the down-conversion. In this case, the local oscillators and buffers can operate at a lower frequency, resulting in lower power consumption. One drawback of this method is that the down-converted signal with the main harmonic will be present at the output and is about three times stronger than the down-converted signal by the third harmonic for example (for a square wave, a Fourier series analysis shows that the nth harmonic has an amplitude proportional to 1/n).

FIG. 1A is a schematic of an RF front-end 100 of an RF receiver using the third harmonic for down-conversion in single mode (the actual RF front-end uses a differential passive mixer) comprising a 3-path passive mixer (Jaeho Im et. al., A 220-μw—83-dBm 5.8-GHz Third-Harmonic Passive Mixer-First LP-WUR for IEEE 802.11ba).

FIG. 1B is a schematic of an equivalent model of a two-path passive mixer linear time-invariant (LTI) 102 and an equivalent model of a third harmonic passive mixer LTI circuit 104 (Jaeho Im et. al., A 220-μw—83-dBm 5.8-GHz Third-Harmonic Passive Mixer-First LP-WUR for IEEE 802.11ba).

SUMMARY

It is desirable to provide an apparatus comprising a local oscillator (LO) for driving a mixer having reduced power requirements when compared to prior art systems.

According to a first aspect of the disclosure there is provided an apparatus comprising a local oscillator (LO) for driving a mixer, the LO being configured to oscillate at an oscillation frequency, and generate a first set of LO signals, wherein each of the first set of LO signals has a LO signal frequency equal to a first multiplication factor m multiplied by the oscillation frequency, the first multiplication factor m being an integer greater than or equal to two, and each of the first set of LO signals is separated by adjacent LO signals by a phase difference equal to 360° divided by a first variable n, the first variable n being an integer that is greater than or equal to two.

Optionally m and n are equal.

Optionally the apparatus is configured to down-convert or up-convert an RF signal with an n-th harmonic of the LO signal frequency, the first variable being equal to n.

Optionally the first multiplication factor denotes the number of LO signals within the first set of LO signals.

Optionally, the LO comprises a ring oscillator oscillating at the oscillation frequency.

Optionally, the ring oscillator comprises k multiplied by n multiplied by m stages, where k is an integer greater than or equal to one.

Optionally, each stage comprises an inverter comprising an input coupled to an output of an inverter of the previous stage, and comprising an output coupled to an input of an inverter of the next stage.

Optionally, each inverter of each stage is configured to generate a ring oscillator signal that is separated by the ring oscillator signals of adjacent stages by a phase difference equal to a fraction having a numerator of 360° and a denominator of n multiplied by ln.

Optionally, the LO comprises a plurality of frequency multiplication circuits for generating the first set of LO signals Optionally, there are n frequency multiplication circuits.

Optionally, each frequency multiplication circuit is configured to receive a subset of the ring oscillator signals, where the subset of the ring oscillator signals are different from those received by each additional frequency multiplication circuit and the subset of ring oscillator signals are separated by adjacent ring oscillator signals within the subset by a phase difference equal to 360° divided by n.

Optionally, each frequency multiplication circuit is configured to generate one of the first set of LO signals using the subset of the ring oscillator signals received by said frequency multiplication circuit.

Optionally, each frequency multiplication circuit is configured to generate a LO signal in a high state when $$\frac{n+1}{2}$$

of the ring oscillator signals received by said frequency multiplication circuit are simultaneously in a high state, otherwise said frequency multiplication circuit is configured to generate a LO signal in a low state.

Optionally, the frequency multiplication circuit is a logic circuit.

Optionally, n is equal to three, such that each of the first set of LO signals is separated by adjacent LO signals by a phase difference equal to 120°.

Optionally, the LO comprises a ring oscillator oscillating at the oscillation frequency and the ring oscillator comprises nine stages.

Optionally, each stage comprises an inverter comprising an input coupled to an output of an inverter of the previous stage, and comprising an output coupled to an input of an inverter of the next stage.

Optionally, each inverter of each stage is configured to generate a ring oscillator signal that is separated by the ring oscillator signals of adjacent stages by a phase difference equal to 40°.

Optionally, the LO comprises three frequency multiplication circuits for generating the first set of LO signals.

Optionally, each frequency multiplication circuit is configured to receive a subset of the ring oscillator signals, where the subset of the ring oscillator signals are different from those received by each additional frequency multiplication circuit and the subset of ring oscillator signals are separated by adjacent ring oscillator signals within the subset by a phase difference equal to 120°.

Optionally, each frequency multiplication circuit is configured to generate one of the first set of LO signals using the subset of the ring oscillator signals received by said frequency multiplication circuit.

Optionally each frequency multiplication circuit is configured to generate a LO signal in a high state when two of the ring oscillator signals received by said frequency multiplication circuit are simultaneously in a high state, otherwise said frequency multiplication circuit is configured to generate a LO signal in a low state.

Optionally, the frequency multiplication circuit is a logic circuit.

Optionally, n is equal to five, such that each of the first set of LO signals is separated by adjacent LO signals by a phase difference equal to 72°.

Optionally, the LO comprises a ring oscillator oscillating at the oscillation frequency and the ring oscillator comprises 25 stages.

Optionally, each stage comprises an inverter comprising an input coupled to an output of an inverter of the previous stage, and comprising an output coupled to an input of an inverter of the next stage.

Optionally, each inverter of each stage is configured to generate a ring oscillator signal that is separated by the ring oscillator signals of adjacent stages by a phase difference equal to 14.4°.

Optionally, the LO comprises five frequency multiplication circuits for generating the first set of LO signals.

Optionally, each frequency multiplication circuit is configured to receive a subset of the ring oscillator signals, where the subset of the ring oscillator signals are different from those received by each additional frequency multiplication circuit and the subset of ring oscillator signals are separated by adjacent ring oscillator signals within the subset by a phase difference equal to 72°.

Optionally, each frequency multiplication circuit is configured to generate one of the LO signals using the subset of the ring oscillator signals received by said frequency multiplication circuit.

Optionally, each frequency multiplication circuit is configured to generate a LO signal in a high state when three of the ring oscillator signals received by said frequency multiplication circuit are simultaneously in a high state, otherwise said frequency multiplication circuit is configured to generate a LO signal in a low state.

Optionally, the apparatus comprises a buffer circuit, wherein the mixer receives the LO signals via the buffer circuit.

Optionally, the buffer circuit is configured to process the LO signals to ensure they are suitable to drive the mixer.

Optionally, the buffer circuit comprises at least n inverters, wherein each LO signal is provided to one of the inverters.

Optionally, the buffer circuit comprises 2n inverters, where each LO signal is provided to two of the inverters coupled in series.

Optionally, the apparatus comprises the mixer, wherein the mixer comprises at least n switches, wherein each LO signal is provided to one of the switches.

Optionally, the mixer comprises 2n switches, where each LO signal is provided to one of the switches, and each inverted LO signal is provided to another one of the switches.

Optionally, the apparatus comprises a buffer circuit, wherein the mixer receives the LO signals via the buffer circuit.

Optionally, the buffer circuit is configured to process the LO signals to ensure they are suitable to drive the mixer.

Optionally, the buffer circuit comprises at least n inverters, wherein each LO signal is provided to one of the inverters.

Optionally, the buffer circuit comprises 2n inverters, where each LO signal is provided to two of the inverters coupled in series.

Optionally, the mixer comprises 2n switches, where each LO signal is provided to one of the switches via a first inverter, and each inverted LO signal is provided to another one of the switches via a second inverter coupled in series with the first inverter.

Optionally, the LO is configured to generate a second set of LO signals, wherein each of the second set of LO signals has a LO signal frequency equal to the first multiplication factor m multiplied by the oscillation frequency, each of the second set of LO signals is separated by adjacent LO signals within the second set by a phase difference equal to 360° divided by the first variable n, and each of the second set of LO signals has a phase difference of 180° divided by the first variable n when compared with a corresponding LO signal within the first set of LO signals.

Optionally, the mixer is a differential mixer.

Optionally, the LO comprises a ring oscillator oscillating at the oscillation frequency.

Optionally, the ring oscillator comprises two multiplied by k multiplied by n multiplied by m stages, where k is an integer greater than or equal to one.

Optionally, each stage comprises an inverter comprising an input coupled to an output of an inverter of the previous stage, and comprising an output coupled to an input of an inverter of the next stage.

Optionally, each inverter of each stage is configured to generate a ring oscillator signal that is separated by the ring oscillator signals of adjacent stages by a phase difference equal to a fraction having a numerator of 360° and a denominator of two multiplied by n multiplied by m.

Optionally, the LO is configured to generate a third set of LO signals, wherein each of the third set of LO signals has a LO signal frequency equal to the first multiplication factor multiplied by the oscillation frequency, each of the third set of LO signals is separated by adjacent LO signals within the third set by a phase difference equal to 360° divided by the first variable, and each of the third set of LO signals has a phase difference of 90° divided by the first variable when compared with a corresponding LO signal within the second set of LO signals.

Optionally, the LO is configured to generate a fourth set of LO signals, wherein each of the fourth set of LO signals has a LO signal frequency equal to of the first multiplication factor multiplied by the oscillation frequency, each of the fourth set of LO signals is separated by adjacent LO signals within the fourth set by a phase difference equal to 360° divided by the first variable, and each of the fourth set of LO signals has a phase difference of 90° divided by the first variable when compared with a corresponding LO signal within the first set of LO signals.

Optionally, the mixer is a differential mixer.

Optionally, the LO comprises a ring oscillator oscillating at the oscillation frequency.

Optionally, the ring oscillator comprises four multiplied by k multiplied by n multiplied by m stages, where k is an integer greater than or equal to one.

Optionally, each stage comprises an inverter comprising an input coupled to an output of an inverter of the previous stage, and comprising an output coupled to an input of an inverter of the next stage.

Optionally, each inverter of each stage is configured to generate a ring oscillator signal that is separated by the ring oscillator signals of adjacent stages by a phase difference equal to a fraction having a numerator of 360° and a denominator of four multiplied by n multiplied by m.

Optionally, the duty cycle of each of the LO signals of the first and/or second and/or third and/or fourth set of LO signals comprises the nth harmonic of the oscillation frequency in its Fourier Series. Optionally, the duty cycle is equal to 50% and n is odd. Optionally, the duty cycled is equal to 25% and n is even.

Optionally, the apparatus comprises an image frequency rejection circuit comprising the local oscillator and the mixer.

Optionally, the image frequency rejection circuit comprises at least one additional local oscillator for driving an additional mixer, the additional LO being configured to oscillate at a second oscillation frequency and generate a first additional set of LO signals; wherein each of the first set of additional LO signals has a LO signal frequency equal to a second multiplication factor h multiplied by the second oscillation frequency, the second multiplication factor h being an integer greater than or equal to two; and each of the first set of additional LO signals is separated by adjacent LO signals by a phase difference equal to 360° divided by the first variable.

Optionally, the image frequency rejection circuit is configured to enhance interference rejection.

Optionally, the apparatus is configured to down-convert or up-convert an RF signal with an n-th harmonic of the LO signal frequency, the first variable being equal to n, the RF signal being in the middle of two advertising channels.

Optionally, the LO is configured to generate a second set of LO signals, wherein each of the second set of LO signals has a LO signal frequency equal to the first multiplication factor m multiplied by the oscillation frequency, each of the second set of LO signals is separated by adjacent LO signals within the second set by a phase difference equal to 360° divided by the first variable n, and each of the second set of LO signals has a phase difference of 180° divided by the first variable n when compared with a corresponding LO signal within the first set of LO signals, generate a third set of LO signals, wherein each of the third set of LO signals has a LO signal frequency equal to the first multiplication factor multiplied by the oscillation frequency, each of the third set of LO signals is separated by adjacent LO signals within the third set by a phase difference equal to 360° divided by the first variable, and each of the third set of LO signals has a phase difference of 90° divided by the first variable when compared with a corresponding LO signal within the second set of LO signals, and generate a fourth set of LO signals, wherein each of the fourth set of LO signals has a LO signal frequency equal to of the first multiplication factor multiplied by the oscillation frequency, each of the fourth set of LO signals is separated by adjacent LO signals within the fourth set by a phase difference equal to 360° divided by the first variable, and each of the fourth set of LO signals has a phase difference of 90° divided by the first variable when compared with a corresponding LO signal within the first set of LO signals.

According to a second aspect of the disclosure there is provided a method of operating an apparatus comprising a local oscillator (LO) for driving a mixer, the LO being configured to oscillate at an oscillation frequency, the method comprising generating a first set of LO signals using the LO, wherein each of the first set of LO signals has a LO signal frequency equal to a first multiplication factor m multiplied by the oscillation frequency, the first multiplication factor m being an integer greater than or equal to two, and each of the first set of LO signals is separated by adjacent LO signals by a phase difference equal to 360° divided by a first variable n, the first variable n being an integer that is greater than or equal to two.

Optionally m and n are equal.

Optionally the apparatus is configured to down-convert or up-convert an RF signal with an n-th harmonic of the LO signal frequency, the first variable being equal to n.

It will be appreciated that the method of the second aspect may include providing and/or using features set out in the first aspect and can incorporate other features as described herein.

BRIEF DESCRIPTION OF THE DRAWINGS

The disclosure is described in further details below by way of example and with reference to the accompanying drawings, in which:

FIG. 5A is a graph showing how the three signals output from the ring oscillator of FIG. 4A vary with time, and how the output signal from the logic cell of FIG. 4 varies with time, and FIG. 5B is a schematic of a specific implementation of the logic cell of FIG. 4A;

FIG. 15A is a schematic of an image frequency rejection circuit in accordance with a fifth embodiment of the present disclosure, FIG. 15B is a schematic of an image frequency rejection circuit configured to enhance interference rejection in accordance with a sixth embodiment of the present disclosure;

DETAILED DESCRIPTION

In the RF front-end 100 the signals in each path of the 3-path passive mixer are down-converted with different phases of 0°, 120° and 240°, and each signal is generated by a 9-stage ring oscillator (RO).

After adding the down-converted signals from these 3 paths, the down-converted signals using the main harmonic will have 0°, 120° and 240° phase differences with respect to each other, which will cancel each other.

The down-converted signals using the third harmonic will have phase differences of 0°, 360° and 720° degrees with respect to each other, and will add up in phase.

Thus, in Jaeho Im et. al., A 220-μw—83-dBm 5.8-GHz Third-Harmonic Passive Mixer-First LP-WUR for IEEE 802.11ba, the RF signal can be down-converted to the IF signal by using a local oscillator that is operating at a third of the RF frequency fRF frequency, without being limited by any signal present at around the RF frequency fRF.

Figure 1A:
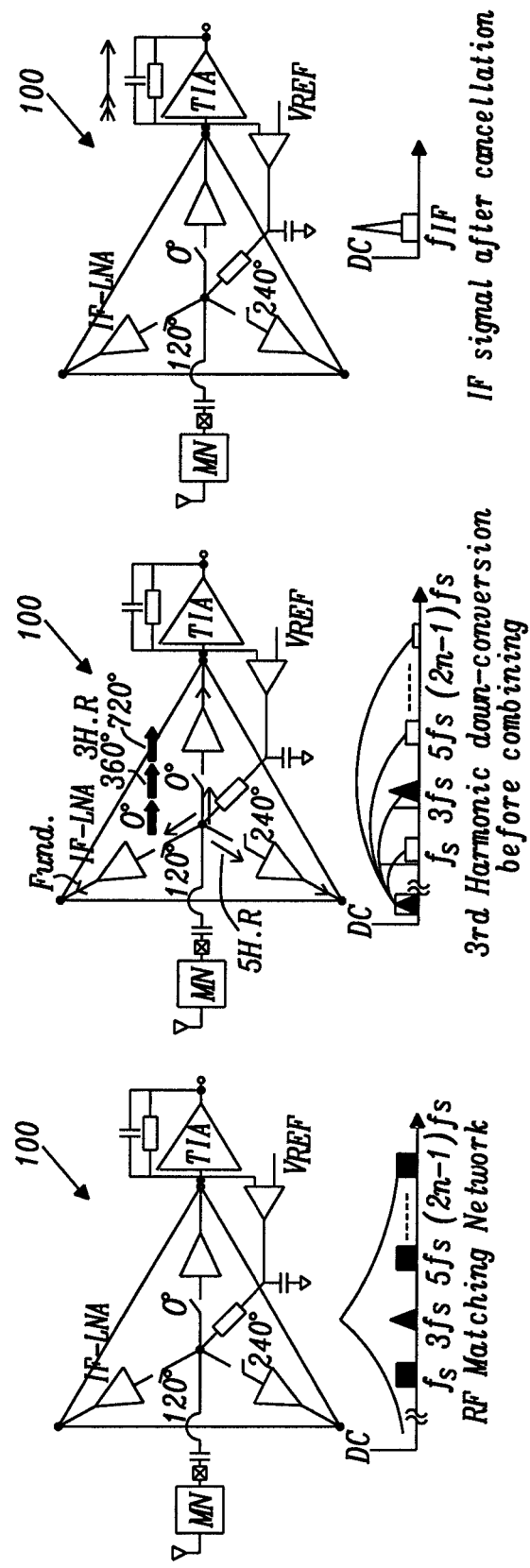
FIG. 1A is a schematic of an RF front-end of an RF receiver.
Figure 1B:
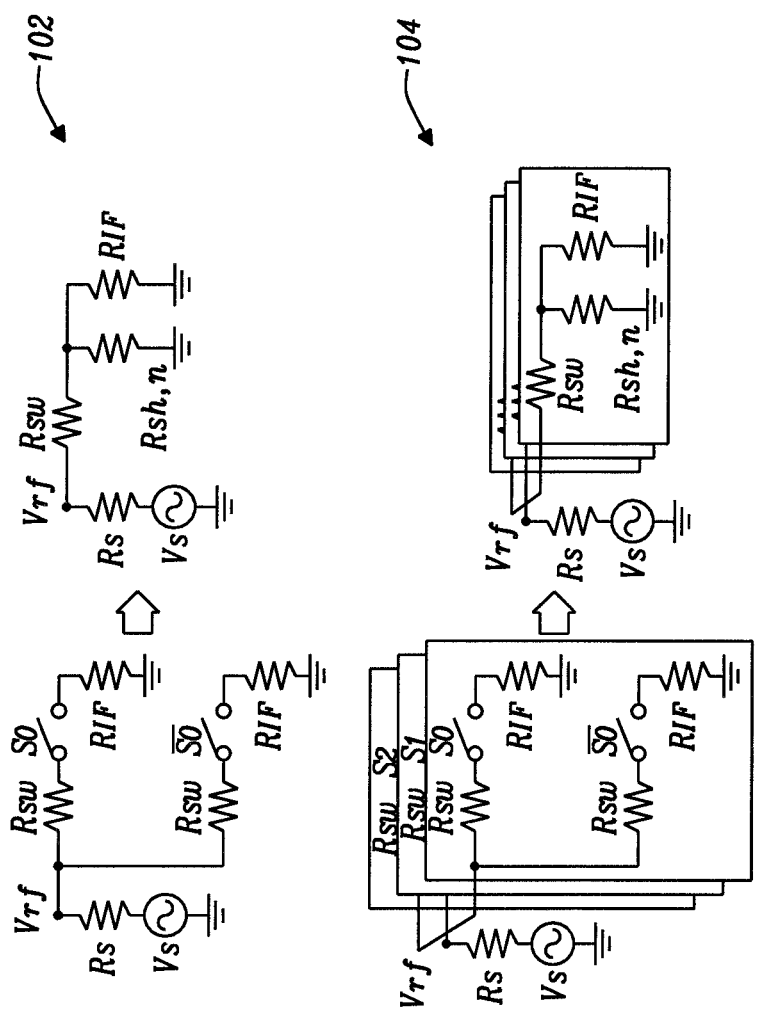
FIG. 1B is a schematic of an equivalent model of a two-path passive mixer linear time-invariant (LTI) and an equivalent model of a third harmonic passive mixer LTI circuit.

It is desirable that RF-receivers require proper matching with an antenna or a PCB transmission line. Regarding the input impedance, the linear time-invariant (LTI) circuits 102, 104 of passive mixers are shown in FIG. 1B.

The circuits 102, 104 may be understood with reference to the following equations in which the meaning of the variables and the equations will be clear to the skilled person.

$$R_{sh,n} = \frac{2\gamma(R_S + R_{sw})R_{IF}}{2(R_S + R_{sw})(n^2 - \gamma) + R_{IF}(n^2 - 2\gamma)}, \quad (1)$$
$$n = 1, 3, 5 \ldots.$$

$$Z_{in}(n\omega_{LO} + \omega_{IF}) = [R_{sw} + (R_{sh,n} \| R_{IF})] \| \left(\frac{1}{j n \omega_{IF} C_{IF}}\right) \quad (2)$$
$$n = 1, 3, 5 \ldots.$$

It can be concluded from equations (1) and (2) that input resistance decreases as higher harmonics are used in down-conversion. With reference to FIG. 1A, there are three paths that are in parallel with each other. Consequently, the input impedance of having 3 paths while using the third harmonic can be obtained as follows:

$$Z_{in-3HR} = \frac{Z_{in}(3\omega_{LO})}{3} = \frac{R_{sw} + (R_{sh,3} \| R_{IF})}{3}. \quad (3)$$

In order to have a rough idea of how much the input resistance of the circuit 100 is smaller than having only one path and using the main harmonic, the following numbers can be considered.

To match the mixer to 50 ohm without having any matching network, a switch size ratio w/l (where w is the width of the switch and l is the length of the switch) of about 2000 is required for the mixer switches in a modern process.

This can be excessive as it requires a lot of driving power from the LO and/or buffers, and adds significant parasitics that can potentially degrade the RF-performance.

However, by having 3 paths and using the third harmonic, the size of the mixer switches can decrease to a ratio of around 150. This reduction in size leads to smaller buffers and lower power consumption for driving the mixer switches, less chip area, and potentially better RF-performance.

Despite the advantages of the circuit presented in Jaeho Im et. al., it is nonetheless still desirable to improve on the power requirements of the prior art. Furthermore the circuit of Jaeho Im et. al., uses a 9-stage ring oscillator (RO), but only three of the nine nodes are used. This can result in either an asymmetrical structure, as the capacitor of the buffers load only these three nodes, or wasted power by providing dummy loads to the remaining six nodes.

The apparatuses and methods disclosed herein overcomes or mitigates one or more of the above-mentioned problems.

Figure 2:
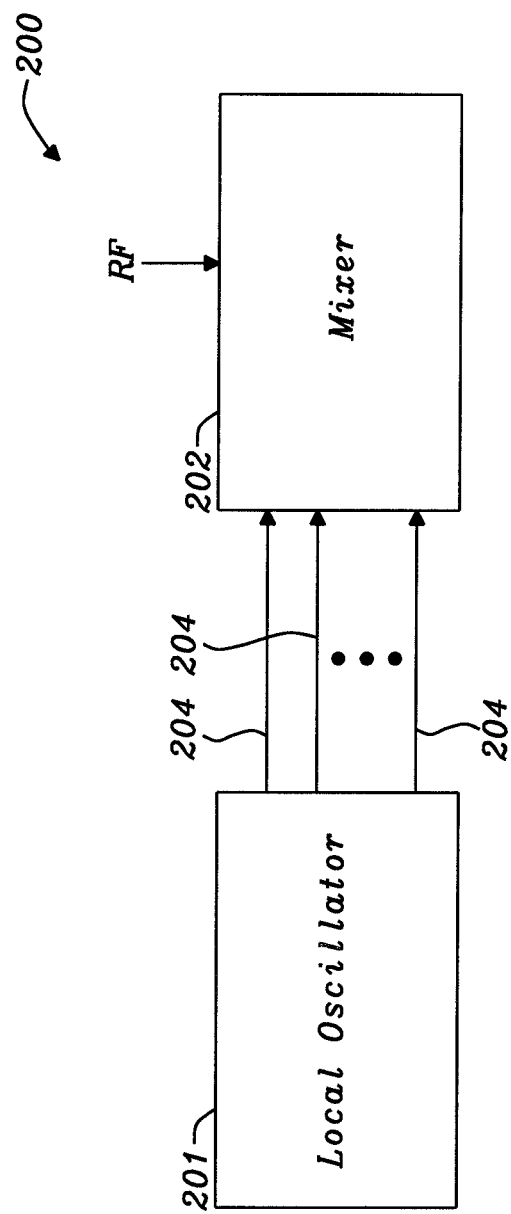
FIG. 2 is a schematic of an apparatus comprising a local oscillator (LO) 201 for driving a mixer, in accordance with a first embodiment of the present disclosure.

FIG. 2 is a schematic of an apparatus 200 comprising a local oscillator (LO) 201 for driving a mixer 202, in accordance with a first embodiment of the present disclosure.

A local oscillator (such as the LO 201) is a well-known apparatus in the field of RF frequency mixing. It is used to generate LO signals having frequencies that are dependent on the oscillation frequency of the local oscillator. The LO signals are "mixed" with an RF signal (labelled RF in the Figure) by the mixer 202 to generate an output signal having a new frequency that is dependent on the RF signal and the LO signals.

The LO 201 is configured to oscillate at an oscillation frequency f0 and to generate a plurality of LO signals 204, for example a first set of LO signals 204.

Each of the LO signals 204 has a LO signal frequency fLO equal to a first multiplication factor m multiplied by the oscillation frequency f0. This may be described as follows:

$$fLO = mf0 \quad (4)$$

m is an integer that greater than or equal to two and may also denote the number of LO signals 204. f0 is the fundamental frequency of oscillation of the LO. fLO denotes that fundamental frequency that may drive the mixer switches.

Each of the LO signals is separated by adjacent LO signals by a phase difference $\Delta\theta$ equal to 360° divided by a variable n. The variable n is an integer that is greater than or equal to two. This may be described as follows:

$$\Delta\theta = \frac{360°}{n} \quad (5)$$

The apparatus 200 may be used in ultra-low power receivers, for example, mixer-first architectures, for e.g. wake-up receivers in Bluetooth Low-Energy systems.

By combining multiple instances of these mixers in parallel, and having suitable frequency arrangements, image rejection problems may be mitigated or avoided when receiving three existing BLE advertising channels.

The apparatus 200 can also be used for up-conversion in transmitters. In a combination of a transmitter and receiver (TX+RX), the apparatus 200 may be suitable for disposable transceivers (e.g. in medical asset tracking).

The apparatus 200 may be used at frequencies beyond the transition frequency fT of the process. For example, the maximum switching frequency in the apparatus 200 may be fRF/3, where fRF is the frequency of the RF signal. The mixer 202 may, for example, be a passive mixer circuit.

The local oscillator 201 may operate at a frequency equal to f0=fRF/(n×m).

The apparatus 200 may be configured to down-convert or up-convert an RF signal with an n-th harmonic of the LO signal frequency fLO. n denotes the n-th harmonic of the LO signal frequency fLO, such that fRF=nfLO. Furthermore, f0=fLO/m. m and n may be equal.

For a three-path mixer where n is equal to 3 and m is equal to 3 the operation frequency is f0=fRF/9. As described previously, the local oscillator Jaeho Im et. al., A 220-µw—83-dBm 5.8-GHz Third-Harmonic Passive Mixer-First LP-WUR for IEEE 802.11ba must operate at a third of the oscillation frequency such that f0=fRF/3. As the local oscillator of the present disclosure can operate at a lower frequency compared with the prior art system it provides a decrease in power requirements when compared with the prior art.

Figure 3:
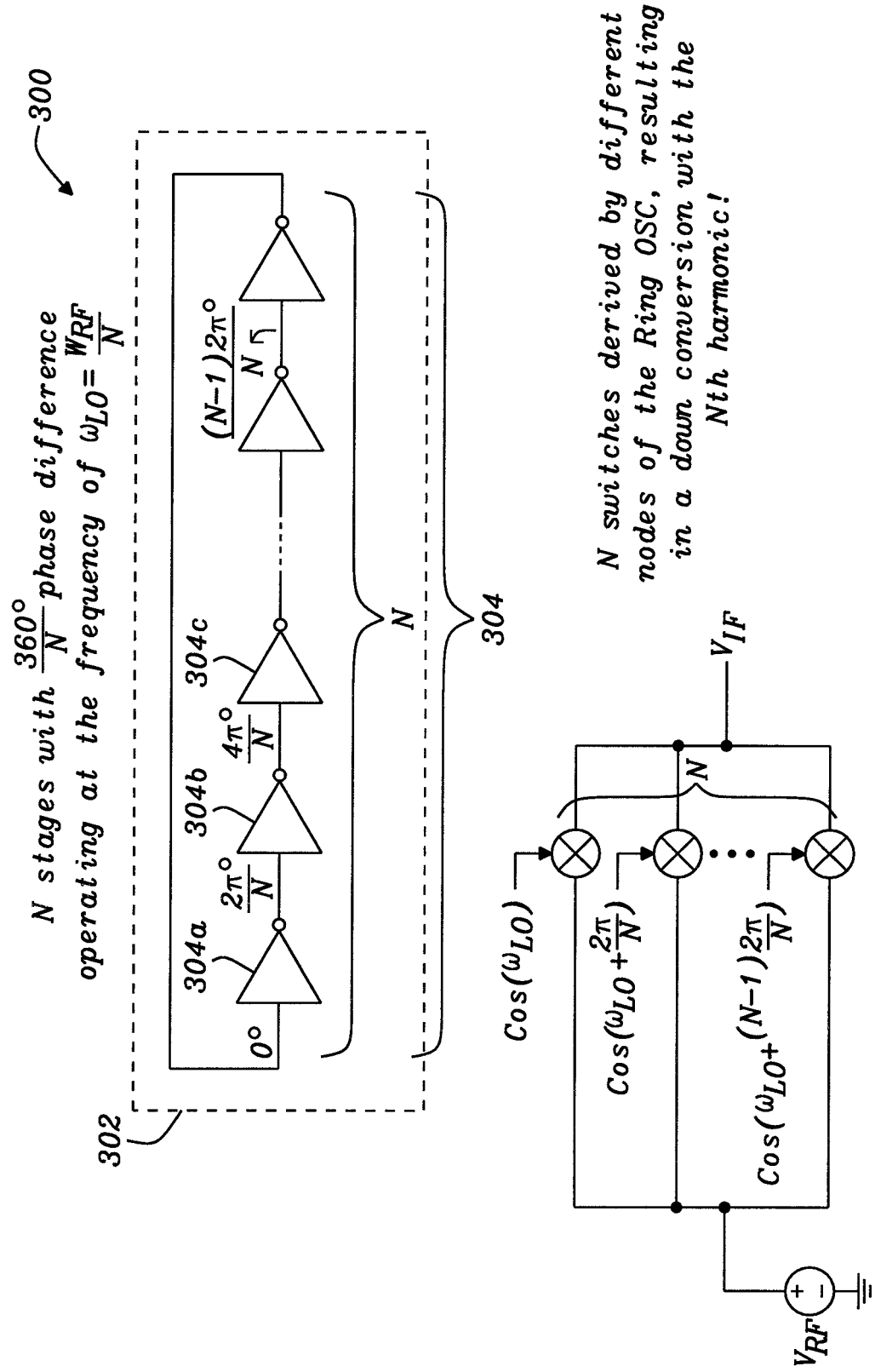
FIG. 3 is a schematic of an apparatus in accordance with a second embodiment of the present disclosure.

FIG. 3 is a schematic of an apparatus 300 in accordance with a second embodiment of the present disclosure. The apparatus 300 comprises a LO 302, which is a specific embodiment of the LO 202 as previously described. The LO 302 comprises a ring oscillator oscillating at the oscillation frequency f0. The ring oscillator may comprise k×n×m stages, where n is the integer as previously discussed in relation to the first embodiment, m is a frequency multiplication factor, which is an integer that is greater than or equal to two, and k is an integer that is greater than or equal to one.

In general, the number of stages is equal to k×n×m. FIG. 3 shows one example in which k and m are equal to 1. So, the number of stages is equal to n which is exactly the harmonic that is used.

In the present embodiment each stage comprises an inverter 304 comprising an input coupled to an output of an inverter of the previous stage and comprising an output coupled to an input of an inverter of the next stage. For example, a first inverter 304a has its output coupled to an input of a second inverter 304b. The second inverter 304b has its output coupled to an input of a third inverter 304c.

In the present embodiment, each inverter 304 of each stage is configured to generate a ring oscillator signal 306 that is separated by the ring oscillator signals of adjacent stages by a phase difference equal to 360° divided by (n×m). Also shown is a mixer 308.

Figure 4A:
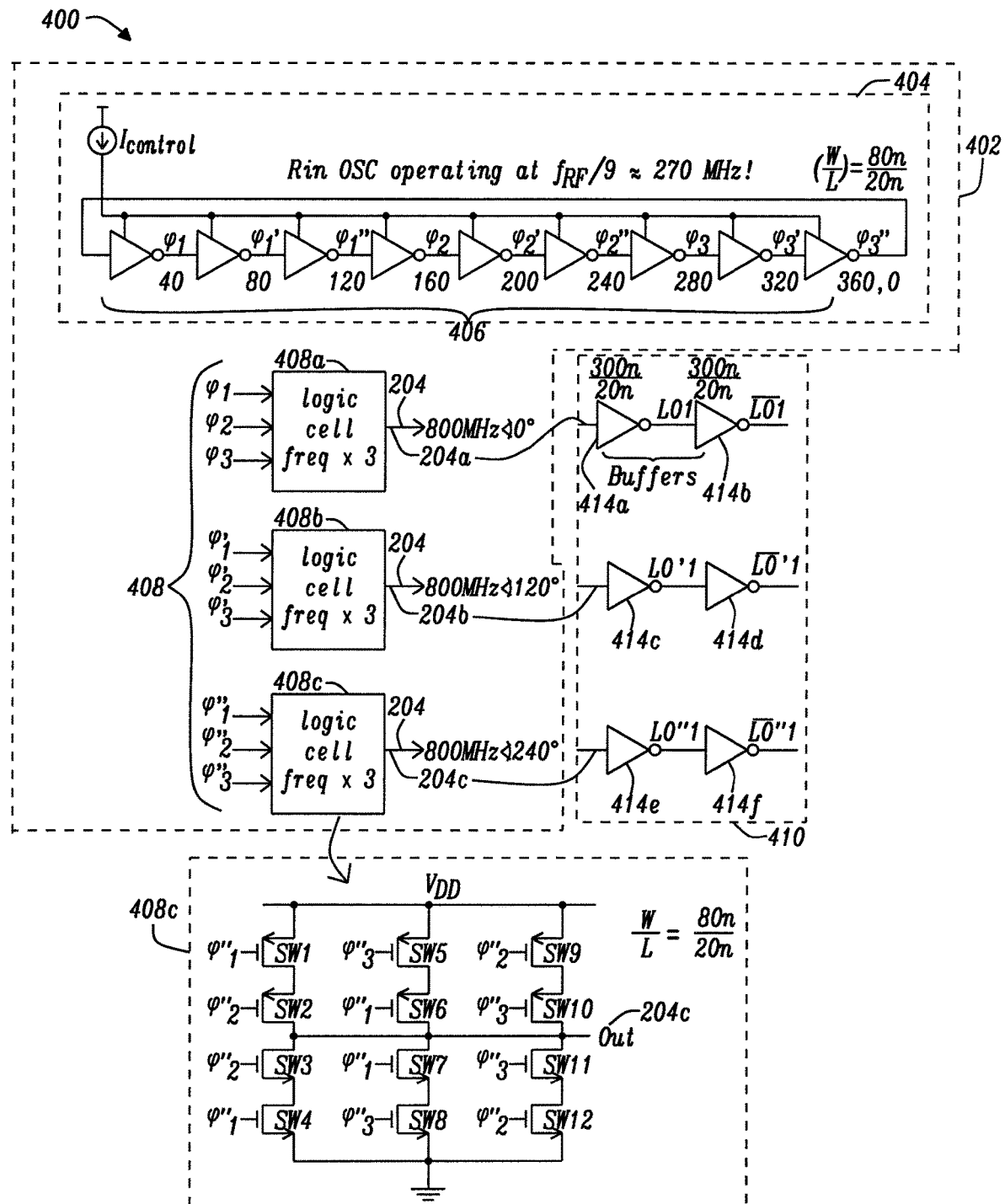
FIGS. 4A and 4B are schematics of an apparatus in accordance with a third embodiment of the present disclosure.

FIG. 4A is a schematic of an apparatus 400 in accordance with a third embodiment of the present disclosure. The apparatus 400 comprises LO 402 which comprises a ring oscillator 404, where each stage of the ring oscillator comprises an inverter 406. The LO 402 further comprises n frequency multiplication circuits 408 for generating the plurality of LO signals 204. The LO 402 is a specific embodiment of the LO 202 as previously described. The size of these inverters are the smallest size possible in 22 nm Fully Depleted Silicon on Insulator (FDSOI) technology which is w=80 nm and l=20 nm (w is the width and l is the length of the CMOS transistor).

It will be appreciated that m may refer to the multiplication factor applied by the frequency multiplication circuits.

It will be appreciated that the frequency multiplication circuits may comprise logic circuits and may alternatively be referred to as logic cells or edge-combiner or any other suitable name in accordance with the understanding of the skilled person. In the following discussions logic cells will be presented however it will be appreciated that further embodiments may use different types of frequency multiplication circuits.

Each logic cell 408 is configured to receive a subset of the ring oscillator signals, where the subset of the ring oscillator signals are different from those received by each additional logic cell 408 and the subset of ring oscillator signals are separated by adjacent ring oscillator signals within the subset by a phase difference equal to 360° divided by n. Each logic cell 408 is configured to generate one of the LO signals 204 using the subset of the ring oscillator signals received by said logic cell 408. In the present embodiment, each logic cell 408 is configured to generate one of the LO signals 204 using the subset of the ring oscillator signals received by said logic cell 408.

A first logic cell 408a is used to generate a LO signal 204a, a second logic cell 408b is used to generate a LO signal 204b and a third logic cell 408c is used to generate a LO signal 204c.

In the present embodiment, three LO signals 204 are generated and therefore n=3. With reference to equation (4), the LO signal frequency fLO is equal to 3f0. With reference to equation (5) the phase difference $\Delta\theta$ between adjacent LO signals 204 is 120°.

In the present embodiment, the LO 402 comprises the ring oscillator 404 oscillating at the oscillation frequency f0 and the ring oscillator 404 comprises nine stages. As discussed previously, the ring oscillator 404 may comprise $n^2$ stages, where n=3 in the present embodiment.

As discussed previously, each stage is configured to generate a ring oscillator signal 306 that is separated by the ring oscillator signals of adjacent stages by a phase difference equal to 360° divided by n². Therefore, in the present embodiment each inverter 304 of each stage is configured to generate a ring oscillator signal that is separated by the ring oscillator signals of adjacent stages by a phase difference equal to 40°. As n is equal to 3, the LO 402 comprises three logic circuits 408 for generating the plurality of LO signals 204. The subset of ring oscillator signals are separated by adjacent ring oscillator signals within the subset by a phase difference equal to 120°, as n is equal to 3.

The apparatus 400 is configured to down-convert an RF signal having its RF frequency fRF being equal to 2.41 GHz and having an amplitude of 1 mV into an IF frequency fIF of 10 MHz.

If we want to down-convert the RF signal into an IF one, we need a LO which has a frequency equal to the fRF+FIF. In the present example, it was intended to have a down-conversion to IF frequency of 10 MHz. As a result, there is used a 2.41 GHz RF signal and a 2.4 GHz LO signal was used for the down-conversion. As m=3 and n=3 in this case, there was used a ring oscillator which is operating at 2.4 GHz/(3×3)=270 MHz.

In the present example, the ring oscillator 404 operates at the RF frequency fRF divided by (n×m) which means that the 9-stage ring oscillator of the present example oscillates at 2.4 GHz/9 which is approximately equal to 270 MHz.

Each of the inverters 406 comprises an output node and in the present example, each inverter 406 produces an RO signal at its output node. The first inverter 406a generates an output signal φ1 having a phase shift of 40°, the second inverter 406b generates an output signal φ1' having a phase shift of 80°, the third inverter 406c generates an output signal φ1" having a phase shift of 120°, the fourth inverter 406d generates an output signal φ2 having a phase shift of 160°, the fifth inverter 406e generates an output signal φ2' having a phase shift of 200°, the sixth inverter 406f generates an output signal φ2" having a phase shift of 240°, the seventh inverter 406g generates an output signal φ3 having a phase shift of 280°, the eighth inverter 406h generates an output signal φ3' having a phase shift of 320°, and the ninth inverter 406i generated an output signal φ3" having a phase shift of 360°.

φ1, φ2 and φ3 are provided to a first logic cell 408a, φ1', φ2' and φ3' are provided to second logic cell 408b and, φ1", φ2" and φ3" are provided to a third logic cell 408c.

The output of each logic cell 408 has a frequency approximately equal to 800 MHz with a phase difference of 120° compared to adjacent logic cells 408.

The apparatus 400 may further comprise a buffer circuit 410, where a mixer 412 receives the LO signals 204 via the buffer circuit 410. The mixer 412 is an example of a specific embodiment of the mixer 202 as previously described and it will be appreciated that alternative embodiments are possible. The number of paths in the mixer 412 may be equal to n.

The buffer circuit 410 may be configured to process the LO signals 204 to ensure they are suitable to drive the mixer 412. For example, by ensuring that the LO signals 204 are of sufficient magnitude to drive the switches of the mixer 412. In summary, the outputs of the logic cells 408 go to the buffer circuit 410 in order to drive the mixer switches.

The buffer circuit 410 comprises at least n inverters, and each LO signal 204 is provided to one of the inverters. In the present example the buffer circuit 410 comprises 2n inverters, being six inverters 414a-414f, where each LO signal 204 is provided to two of the inverters coupled in series. Specifically, for each inverter pair receiving one of the LO signals 204, the LO signal 204 is received at an input of one of the inverters, the output of which is provided to an input of the other of the inverters within the pair.

In the present example, LO signal 204a is received by an inverter 414a and provided to an inverter 414b thereby generating LO signals LO1, $\overline{\text{LO1}}$; LO signal 204b is received by an inverter 414c and provided to an inverter 414d thereby generating LO signals LO1', $\overline{\text{LO1}'}$; and LO signal 204c is received by an inverter 414e and provided to an inverter 414f, thereby generating LO signals LO1", $\overline{\text{LO1}''}$.

$\overline{\text{LO1}}$ is an inverted LO signal corresponding to the inverted LO1 signal; $\overline{\text{LO1}'}$ is an inverted LO signal corresponding to the inverted LO1' signal; and $\overline{\text{LO1}''}$ is an inverted LO signal corresponding to the inverter LO1" signal.

Figure 4B:
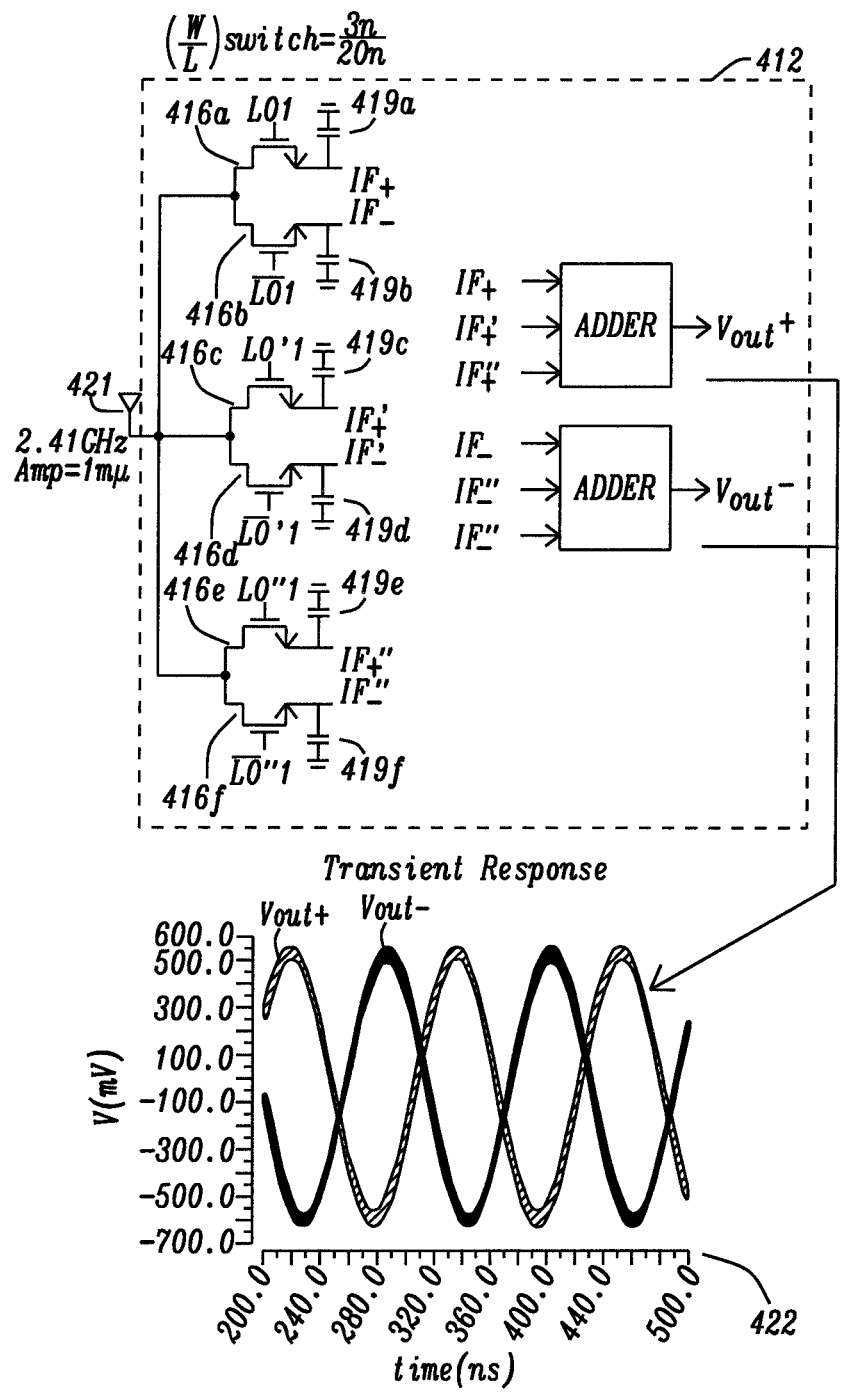

The mixer 412 in FIG. 4B comprises at least n switches 416, where each LO signal is provided to one of the switches 416.

In the present example the mixer 412 comprises at 2n switches, corresponding to six switches 416a, 416b, 416c, 416d, 416e, 416f, where each LO signal is provided to one of the switches 416a, 416c, 416e, and each inverted LO signal is provided to another one of the switches 416b, 416d, 416f. In the present embodiment, the switches 416a-416f each comprise a transistor, with each LO signal or inverted LO signal being provided to a gate of its associated transistor. Each switch 416a-416f may be coupled to a capacitor that is coupled to ground. The capacitors are labelled 419a-419f.

Each switch 416a-416f receives the RF signal having its RF frequency fRF being equal to 2.41 GHz and having an amplitude of 1 mV via an antenna 421. It will be appreciated that fRF as discussed herein relates to the mixer frequency for down, or up, conversion, and the present discussion relates to an idealised situation where the antenna 421 receives this RF frequency. It will be appreciated that in a physical system the antenna 421 may receive a different frequency, and the present discussion relates to design considerations for a specific IF frequency.

For the antenna 421 receiving the RF frequency fRF0 that is not equal to fRF as discussed herein, the intermediate frequency fIF may be fIF=fRF+fRF0 or fIF=fRF−fRF0. Note that frequencies may be negative.

The mixer 412 comprises adders 418, 420. The outputs from the switches 416a-416f are provided to the adders 418, 420. The output of the switch 416a is intermediate frequency signal IF$_+$ and is provided to the adder 418; the output of the switch 416b is intermediate frequency signal IF$_-$ and is provided to the adder 420; the output of the switch 416c is intermediate frequency signal IF$_+$' and is provided to the adder 418; the output of the switch 416d is intermediate frequency signal IF$_-$' and is provided to the adder 420; the output of the switch 416e is intermediate frequency signal IF$_+$" and is provided to the adder 418; the output of the switch 416f is intermediate frequency signal IF$_-$" and is provided to the adder 420.

The adders 418, 420 may add in voltage, current, or charge domain. In the present example, the adders 418, 420 are ideal adder blocks that sum the input voltages in voltage domain.

The adder 418 provides an output signal $V_{out^+}$ which is the resultant signal from the mixer process and has an IF frequency of 10 MHz. The adder 420 provides an output signal $V_{out^-}$ which is the resultant signal from the mixer process and has an IF frequency of 10 MHz, and a phase shift of 180° compared to the signal $V_{out^+}$. Vout+ and Vout− are differential signals. As a result, they have a phase difference of 180 degrees.

A transient response of the IF signals $V_{out^+}$, $V_{out^-}$ is illustrated in the voltage versus time graph 422. The graph 422 illustrated simulation results from a simulation of the apparatus 400 using parameters and variables reflective of a physically implementable circuit.

Also shown in FIG. 4A is a possible implementation of the logic cell 408c. It will be clear to the skilled person how the logic cells 408a, 408b may use the same, or a similar structure. The logic cell 408c comprises switches sw1-sw12, each comprising a transistor and each receiving one of the output signals φ1"-φ3" at its gate.

In the present example there is provided 3-path 3rd harmonic down-conversion with three LO signals 204a, 204b, 204c each with a 120° phase difference and having a frequency equal to a third of the RF frequency fRF. Specifically, the RF frequency is 2.4 GHz, with the frequency of the LO signals 204a, 204b, 204c being a third of 2.4 GHz which is 800 MHz.

Each logic cell 408 is configured to generate a LO signal in a high state when (n+1)/2 of the ring oscillator signals received by said logic cell 408 are simultaneously in a high state, otherwise said logic cell is configured to generate a LO signal in a low state.

In the present example, where n is equal to 3, as φ1", φ2", and φ3" have a phase difference of 120° we use φ1", φ2", and φ3" as inputs for a logic cell that has an output that is high whenever only two of its input signals are high simultaneously.

By implementing φ1"φ2"+φ1"φ3"+φ2" φ3", we have an output signal which has 3 times higher frequency than the inputs. A logic cell implementing this rule is depicted by the logic cell 408c and is also applicable for the logic cells 408a, 408b as will be clear to the skilled person.

FIG. 5A is a graph showing how the three signals φ1, φ2, and φ3 output from the ring oscillator 404 vary with time, and how the output signal 204a from the logic cell 408a varies with time.

FIG. 5B is a schematic of a specific implementation of the logic cell 408a comprising switches sw13-sw24.

Figure 6:
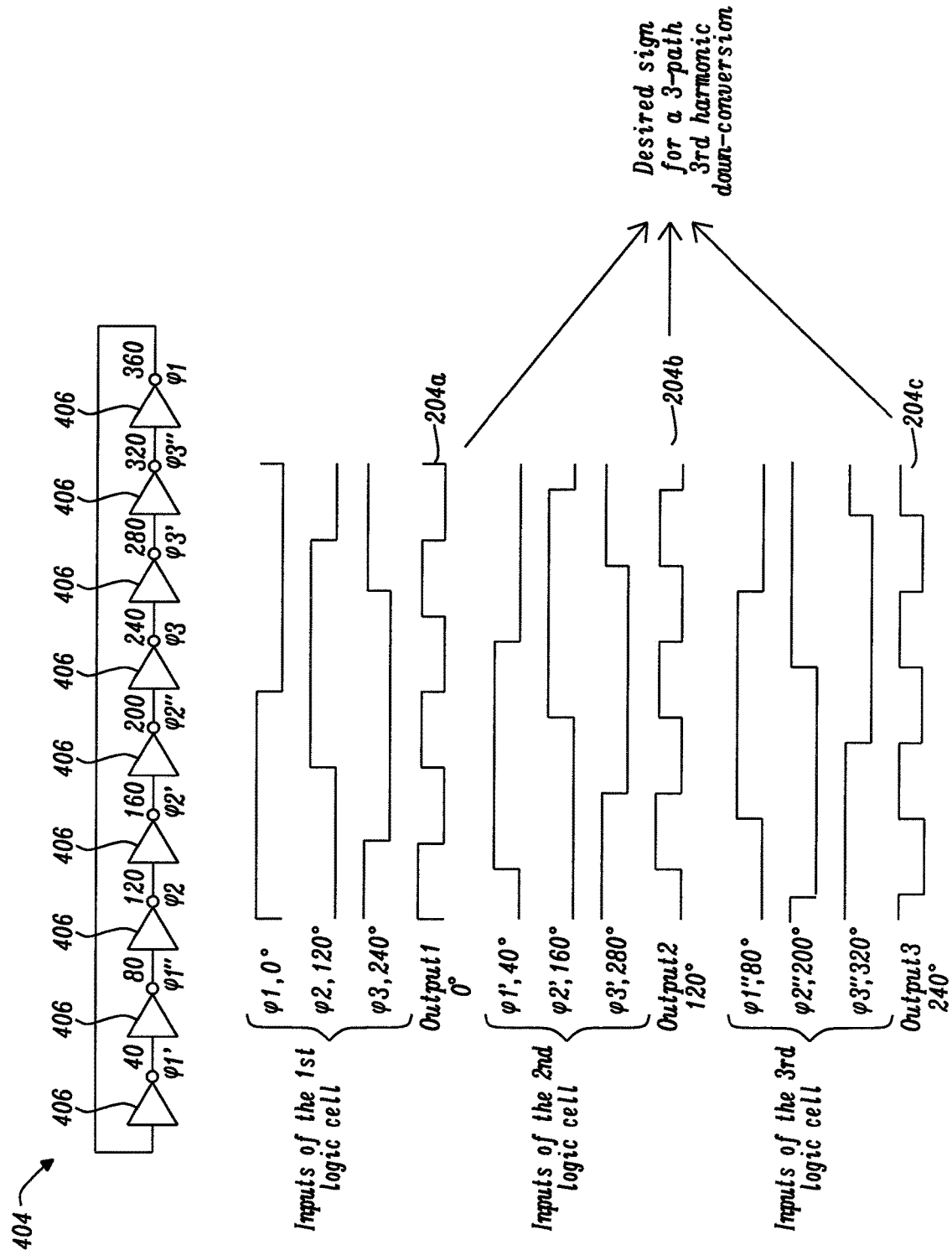
FIG. 6 is a graph showing how the nine signals output from the ring oscillator of FIG. 4 vary with time, and how the output signals vary with time.

FIG. 6 is a graph showing how the nine signals φ1, φ2, φ3, φ1', φ2', φ3', φ1", φ2", φ3" output from the ring oscillator 404 vary with time, and how the output signals 204a, 204b, 204c vary with time. Also shown on the Figure are the phase shifts.

As shown in FIG. 4A there are three logic cells 408, with their inputs coming from a 9-stage ring oscillator (RO) 404. The outputs of these logic cells 408 have a frequency that is 3 times higher than the frequency of their inputs (φ1, φ2, φ3, φ1', φ2', φ3', φ1", φ2", φ3") and the output signals 204a, 204b, 204c have phase difference equal to 0°, 120°, and 240°. This arrangement is suitable for a 3-path 3rd harmonic down-conversion.

In the present example the 2.41 GHz RF signal is down-converted as desired to 10 MHz by using the third harmonic in 3 paths that each is derived by the 800 MHz LO signals.

The adders 418, 420 may be ideal adders that used in to add the signals of these 3 paths. Alternatively low power IF-amplifiers may be used to add the signals of the 3 paths. These 3 paths may be added in current, voltage or charge domain.

The total power consumption of the proposed structure is 18.2 μW based on the transient simulation 422 which excludes the use of ideal adders in a 22 nm FD-SOI process. In these simulations, the 3 paths are added in voltage domain and the capacitor after each switch is for filtering and also reducing the mixer noise as it reduces the bandwidth.

The power consumption of each part was determined as follows:
ring oscillator (404): 9.38 μW
$1^{st}$ set of inverters of the buffer circuit (414a, 414c, 414e): 4 μW
$2^{nd}$ set of inverters of the buffer circuit (414b, 414d, 414f): 3.15 μW
Logic cells (408a, 408b, 408c): 1.6 μW The nodes of the 9-stage RO 404 may be configured to have an identical load at each node. Furthermore, the power consumption can be further reduced by combining the 9 output nodes, such that the RO 404 can oscillate at a 9× lower frequencies.

It will be appreciated that the apparatus 400 may be generalized to any odd or even number of stages. Higher number of down-conversion paths might lead to lower power consumption but higher Noise Figure (NF) as the number of the switches increases. As a result, power might be decreased at the cost of degrading noise performance.

Figure 7:
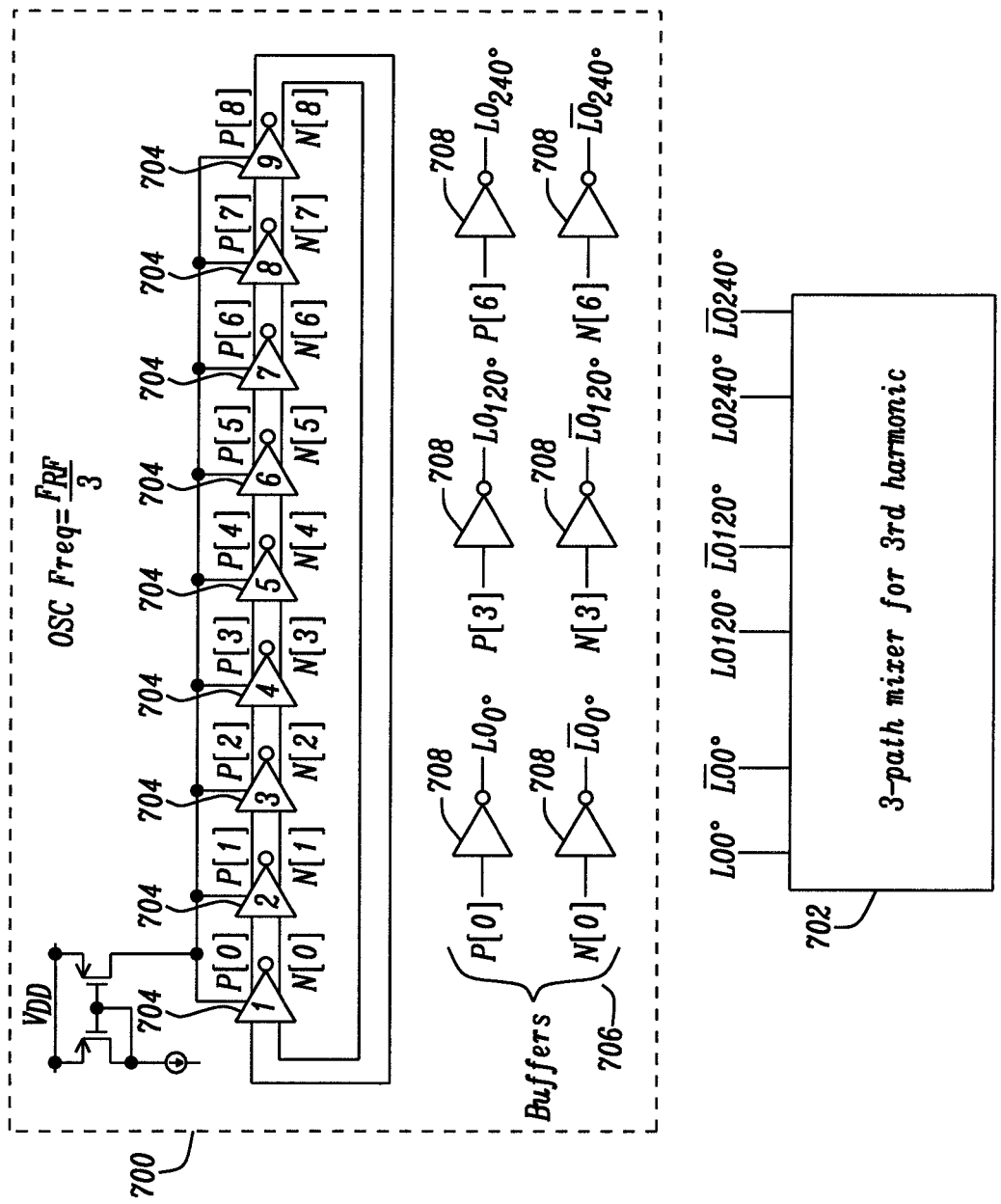
FIG. 7 is a schematic of a prior art local oscillator and mixer.

FIG. 7 is a schematic of a prior art local oscillator 700 and mixer 702 as presented in Jaeho Im et. al., A 220-μw—83-dBm 5.8-GHz Third-Harmonic Passive Mixer-First LP-WUR for IEEE 802.11ba. The local oscillator 700 comprises inverters 704 and buffers 706 comprising inverters 708. The local oscillator 700 of FIG. 7 operates at a frequency being equal to the RF frequency fRF divided by three, as discussed previously. In prior art systems, considerable amounts of power may be consumed for generating LO signals to drive the mixers for down-conversion in the receivers. Furthermore, the prior art does not have symmetrical loading in the ring oscillator nodes, as only 3 out of 9 nodes are going to the buffers and mixer switches.

Figure 8:
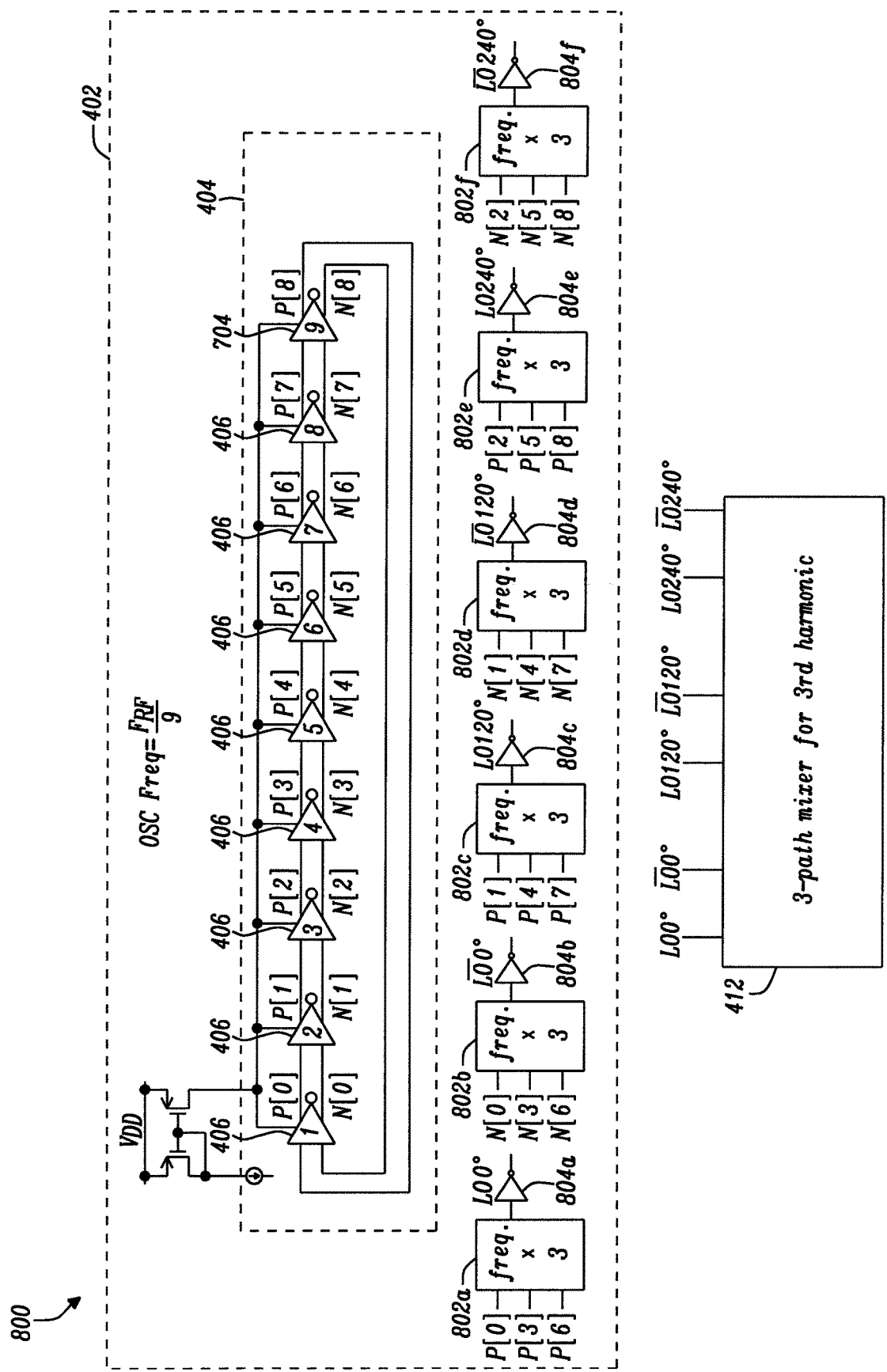
FIG. 8 is a schematic of an apparatus corresponding to an alternative implementation of the apparatus shown in FIG. 4A.

FIG. 8 is a schematic of an apparatus 800 corresponding to an alternative implementation of the apparatus 400 shown in FIG. 4A. The local oscillator 402 of FIG. 8 operates at a frequency being equal to the RF frequency fRF divided by nine.

In the present example, the logic circuits 408 comprise logic circuits 802a, 802b, 802c, 802d, 802e, 802f and the buffer circuits comprise 410 comprise inverters 804a, 804b, 804c, 804d, 804e, 804f. Each of the logic circuits 802a-802f provides an output to one of the inverters 804a-804f.

Instead of having a 9-stage ring oscillator which is operating at fRF/3 and using only 3 nodes with 120° phase difference, as is the case in the apparatus 700 of FIG. 7, the present disclosure provides a 9-stage ring oscillator that is operating at fRF/9, as shown in FIG. 8.

Furthermore, each output node of the 9-stage ring oscillator 404 of FIG. 8 is used as the inputs for logic cells 408 that multiply the frequency by 3 and create the required phase difference of 120°.

As we are using all the output nodes in the ring oscillator 404, the structure is symmetrical. Note also that the logic cells 408 provide the same environment for each of their three inputs, which further improves the symmetry of the design.

As the proposed local oscillator 402 allows the ring oscillator 404 to operate at fRF/9 instead of fRF/3, as is the case of the prior art system in FIG. 7, not only does the ring oscillator 404 of the present disclosure consume less power, we can also further reduce the supply voltage VDD and benefit from going as low as the technology allows in supply voltage to reduce the power of the overall local oscillator 402.

The prior art of FIG. 7, and an embodiment of the present disclosure as shown in FIG. 8 both comprise a 3-path mixer circuit configured to multiply an incoming signal with the third harmonic of the incoming LO signal, whereby the LO signal is provided in such a way that the response to the fundamental LO frequency is 0 in the mixer output signal and input matching is done by merely sizing the mixer switches appropriately.

FIG. 8 includes the following which is not present in the circuit of FIG. 7: a 9-stage ring-oscillator 404 used to create three output signals at three times the fundamental frequency which have 120 degree phase shift between them to reduce the power consumption and to have a symmetrical circuit. In the prior art (such as the circuit of FIG. 7) asymmetry is dealt with by using dummy loads which burn energy and occupy extra area, thereby providing disadvantages when compared to the system of the present disclosure as shown in FIG. 7.

It should be noted that we refer to three output signals (corresponding to 204a, 204b, 204c as described previously) despite six being shown in FIG. 8. This is because FIG. 8 shows the three output signals in addition to the corresponding inverted signals. Therefore, the reference to three output signals and a three-path mixer, despite the illustration of six output signals, will be clear to the skilled person.

A ring oscillator (RO) running at a lower frequency will operate at lower supply voltages than a RO running at a higher frequency. This makes the lower power apparatus 800 of FIG. 8 (and other apparatuses as disclosed herein) more future-proof when compared with the prior art circuit of FIG. 7, as well as easier to integrate in a system operating at low supply voltage for low power consumption.

LC-oscillators can consume a lot of chip area, and pull each other, which can make it hard to have multiple LC-oscillators configured to receive multiple frequencies simultaneously on the same chip. ROs are very small and operate virtually without interaction, which enables easier parallel reception of multiple channels.

A RO running at a lower frequency, as provided by the apparatus 800 of FIG. 8 (and other apparatuses as described herein), may be sufficiently low power, to be kept on as a time-keeping reference (provided it is designed to be stable enough over voltage and temperature). In traditional systems, such as that of FIG. 7, an external crystal or a dedicated RO is often used.

The apparatus 800, and other apparatuses as discloses herein, might be used as a possible feedback path for linearizing the power amplifiers (PA). In case of having extremely low power consumption, the apparatuses disclosed herein could form a Kalman filter loop with the amplitude modulation to phase modulation (AM2PM)/AM2AM pre-distortion, or other HDx optimizations, such as duty-cycle trimming.

Figure 9A:
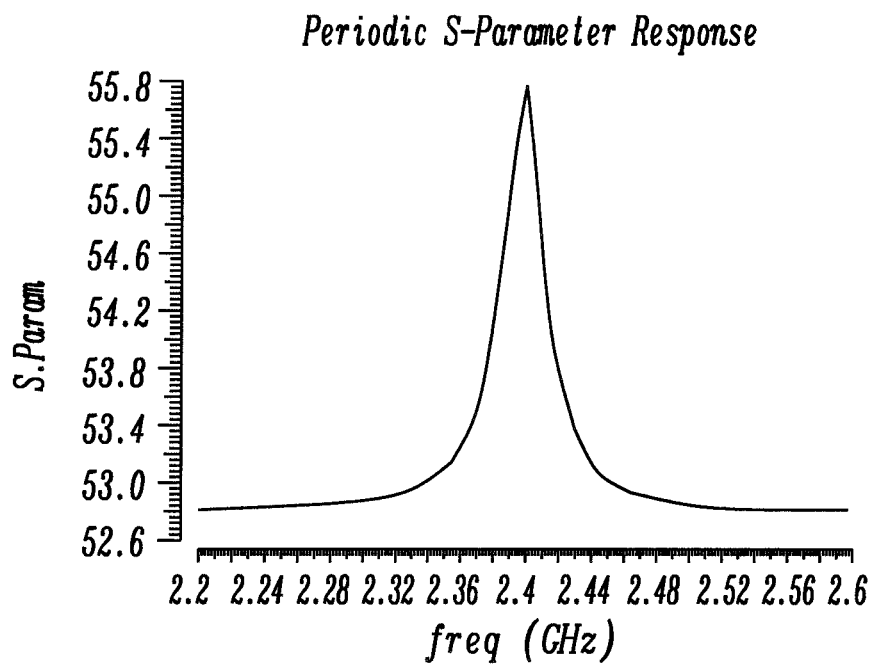
FIG. 9A is a graph of the periodic s-parameter response showing the real part of $Z_{11}$ for a simulation of a practical implementation of the apparatus of FIGS. 4A and 4B.
Figure 9B:
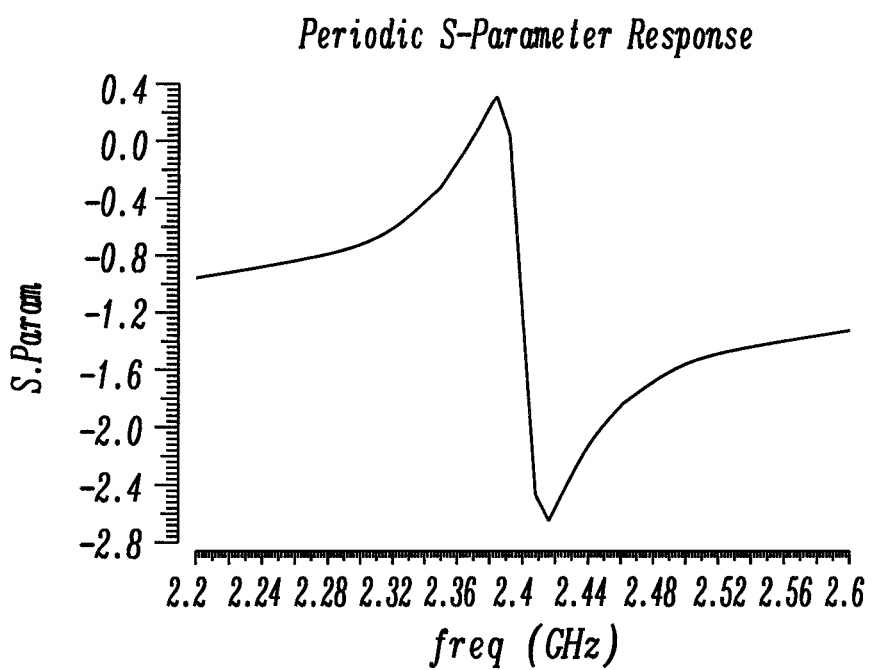
FIG. 9B is a graph of the periodic s-parameter response showing the imaginary part of $Z_{11}$ for a simulation of a practical implementation of the apparatus of FIGS. 4A and 4B.

FIG. 9A is a graph of the periodic s-parameter response showing the real part of $Z_{11}$ for a simulation of a practical implementation of the apparatus 400 of FIG. 4A; and FIG. 9B is a graph of the periodic s-parameter response showing the imaginary part of $Z_{11}$ for a simulation of a practical implementation of the apparatus 400 of FIG. 4A.

In known systems, input matching is often bulky, especially for mixer-first receivers that would otherwise require huge switches, which increases the power consumption and may degrade the RF-performance. The switches of the mixer 412, as shown in FIG. 4B are designed in a way to be matched to 50Ω, without any extra matching network as shown by FIGS. 9A, 9B. As a result, the apparatus 400 of the present disclosure can be configured to down-convert an RF signal without any extra matching network whilst burning only 18 μW, which is an advancement over the prior art in terms of the combination of power consumption versus noise performance. The apparatuses of the present disclosure can provide the ability for inherent matching i.e. no additional matching components required, but they may be used to further improve performance, in accordance with the understanding of the skilled person.

It will be appreciated that the operation of the circuits disclosed herein can be modified and extended to higher harmonics (e.g. using the 5th harmonic instead of the 3rd harmonic for reception) in accordance with the understanding of the skilled person.

Figure 10:
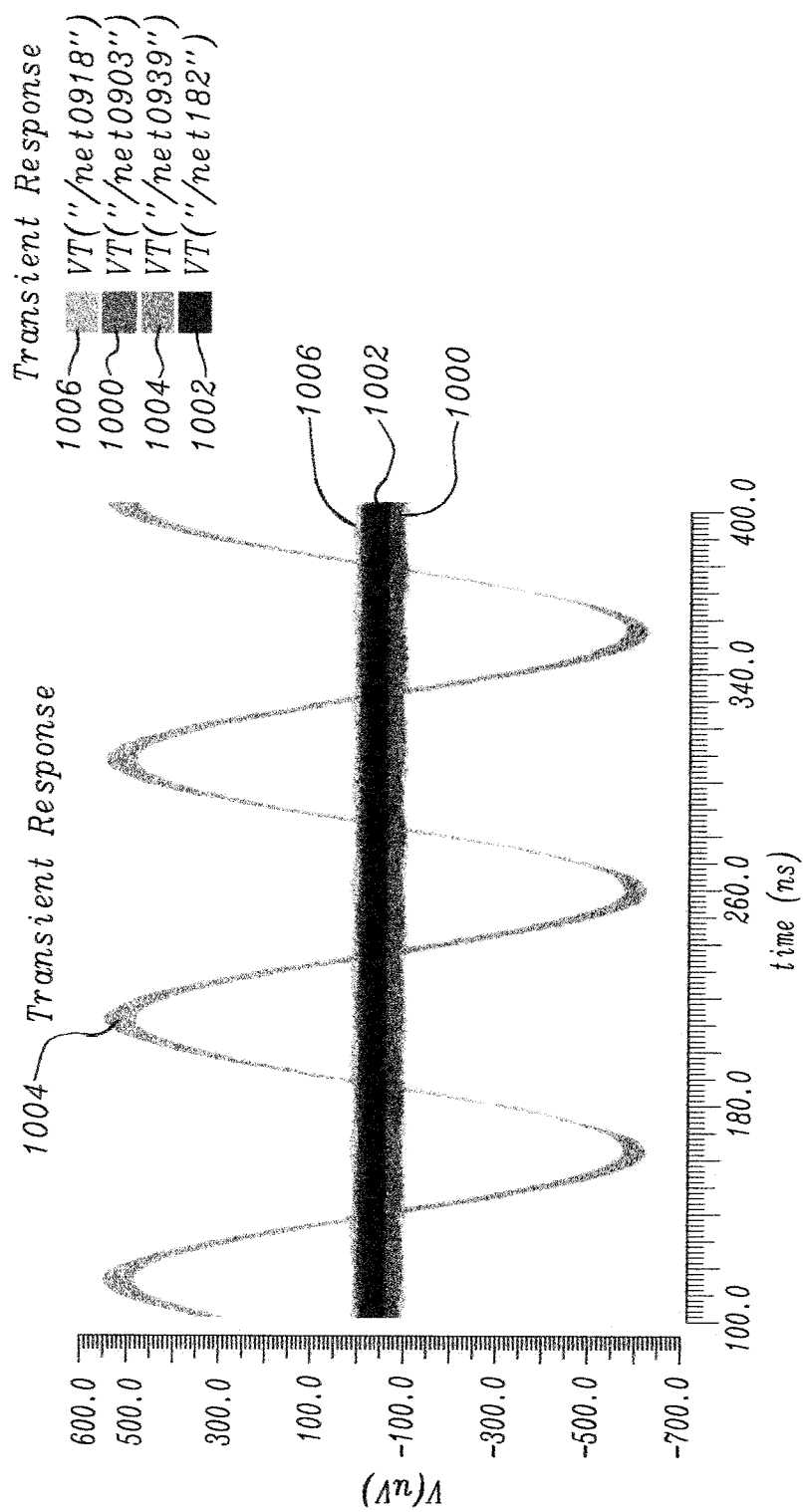
FIG. 10 is a voltage versus time graph showing a transient response of an IF signal for different RF signals as received at the antenna of FIG. 4B.

Furthermore, the apparatus 400 is able to cancel the down-converted signal using the other harmonics except the desired one without any filtering before the mixing stage. FIG. 10 is a voltage versus time graph showing a transient response of the IF signal $V_{out^+}$ for different RF signals having different fRF as received at the antenna 421. A trace 1000 is for an fRF of 810 MHz, a trace 1002 is for an fRF of 1.61 GHz, a trace 1004 is for an fRF of 2.41 GHz and a trace 1006 is for an fRF of 4.01 GHz (each has a 10 MHz offset from the harmonics). It can be observed that only 2.41 GHz is down-converted to 10 MHz, with the first, second and fifth harmonics having been cancelled after the down-conversion. FIG. 10 illustrates simulation results from a simulation of the apparatus 400 using parameters and variables reflective of a physically implementable circuit.

The following description relates to a case where n is equal to 5. Each of the LO signals will be separated from adjacent LO signals by a phase difference equal to 72°. The ring oscillator may comprise 25 stages with each ring oscillator signal being separated by the ring oscillator signals of adjacent stages by a phase difference equal to 14.4°. The LO may comprise five logic circuits for generating the plurality of LO signals.

Each logic cell may be configured to receive a subset of the ring oscillator signals, where the subset of the ring oscillator signals are different from those received by each additional logic cell. The subset of ring oscillator signals may be separated from adjacent ring oscillator signals within the subset by a phase difference equal to 72°.

Each logic cell may be configured to generate a LO signal in a high state when three of the ring oscillator signals received by said logic cell are simultaneously in a high state, otherwise said logic cell is configured to generate a LO signal in a low state.

Figure 11B:
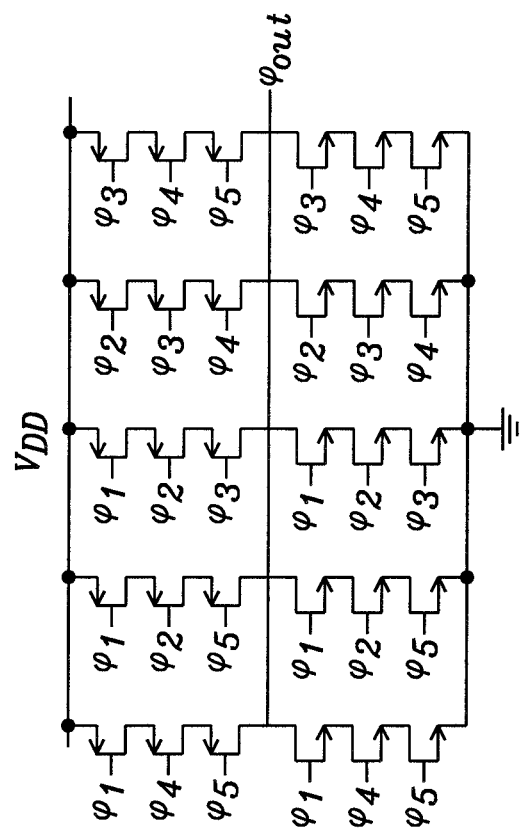
FIG. 11B is a schematic of a specific implementation of one of the logic cells for a five signal implementation.
Figure 11A:
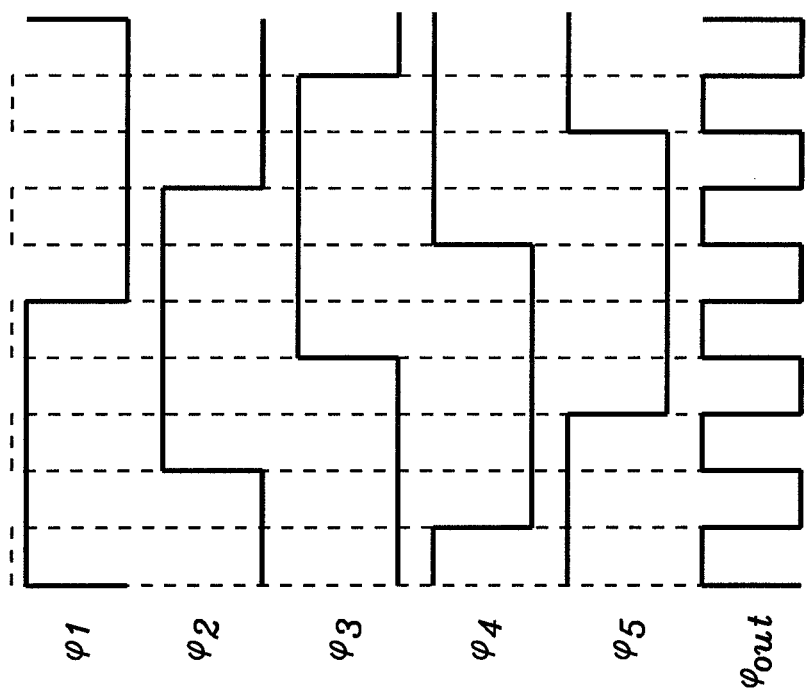
FIG. 11A is a graph showing how the five signals output from an embodiment of the ring oscillator varies with time and how the output signal from one of the five logic cells varies with time.

FIG. 11A is a graph showing how the five signals φ1, φ2, φ3, φ4 and φ5 output from a ring oscillator where n is equal to 5, varies with time, and how the output signal from one of the five logic cells varies with time.

FIG. 11B is a schematic of a specific implementation of one of the logic cells comprising switches. FIG. 11B is a possible implementation for the 5th harmonic. For a possible implementation of the 7th harmonic, the number of columns will be 7 with 4 PMOS on top and 4 NMOS at bottom.

Consequently, for nth harmonic, it will be n columns with n−[n/2] PMOS on top and NMOS at bottom.

However, there may be a limit regarding the number of transistors that can be used in series for each column. Following well-known Boolean algebra, this can be solved by cascading operations, at the cost of some power and some increased phase mismatch between the different outputs.

Figure 12A:
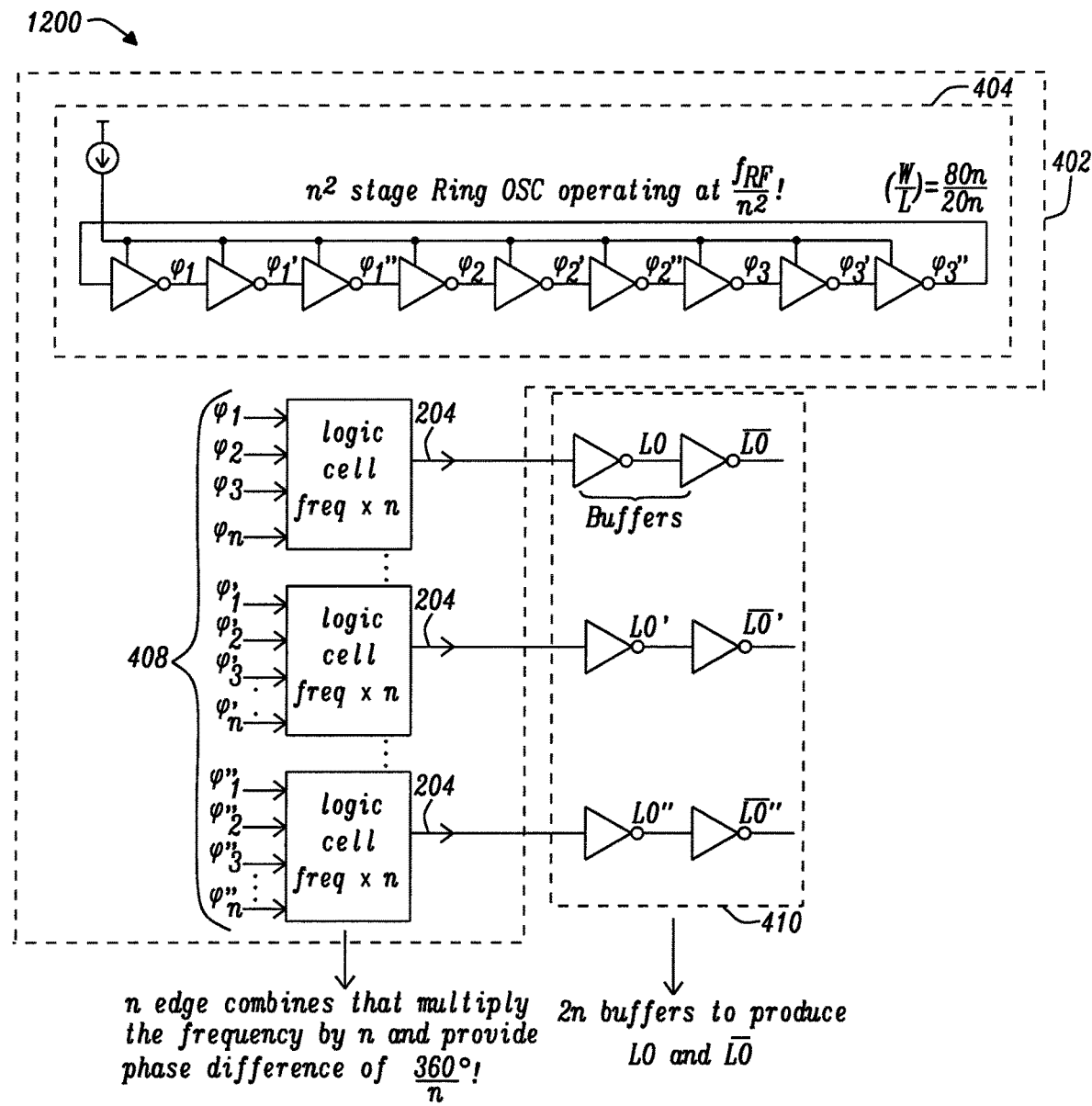
FIGS. 12A and 12B are schematics of an apparatus in accordance with a fourth embodiment of the present disclosure.
Figure 12B:
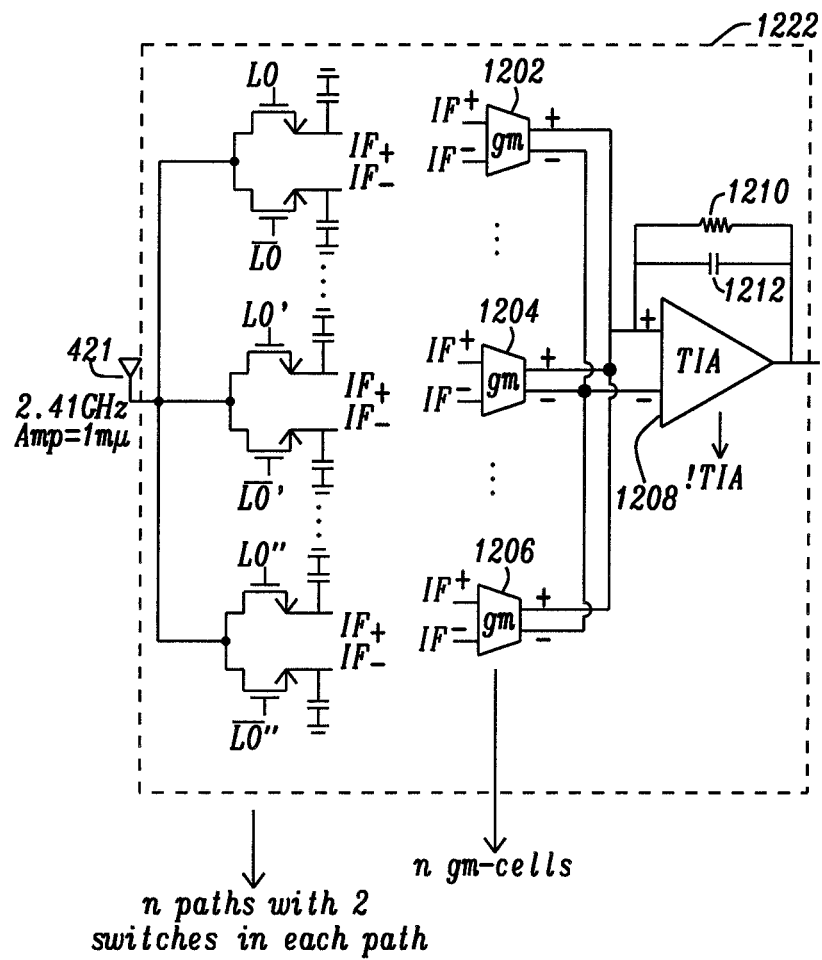

FIG. 12A is a schematic of an apparatus 1200 in accordance with a fourth embodiment of the present disclosure. The apparatus 1200 is a generalised form of FIG. 4A for n LO signals. In the present embodiment the mixer 1222 comprises transconductance amplifiers 1202, 1204, 1206; an amplifier 1208; a resistor 1210; and a capacitor 1212.

Figure 13:
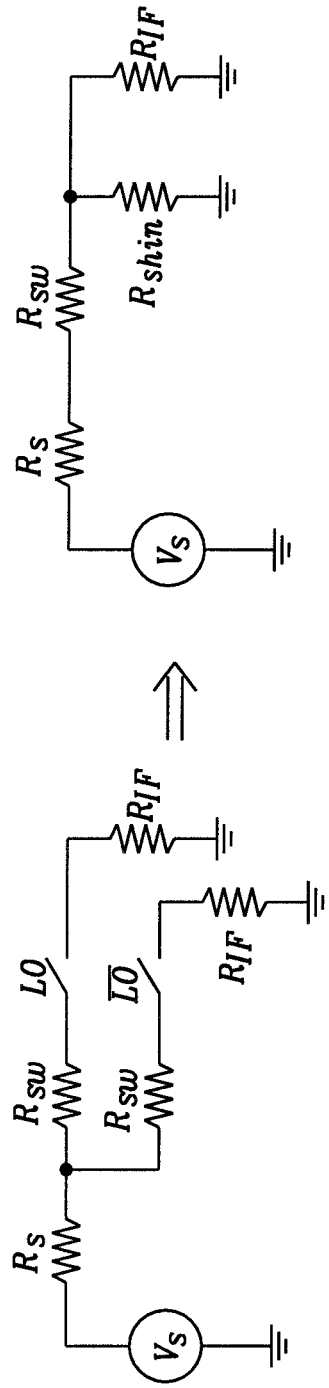
FIG. 13 is a schematic of a possible implementation of the mixer of FIG. 4B for determining its input impedance using the nth harmonic.
Figure 14:
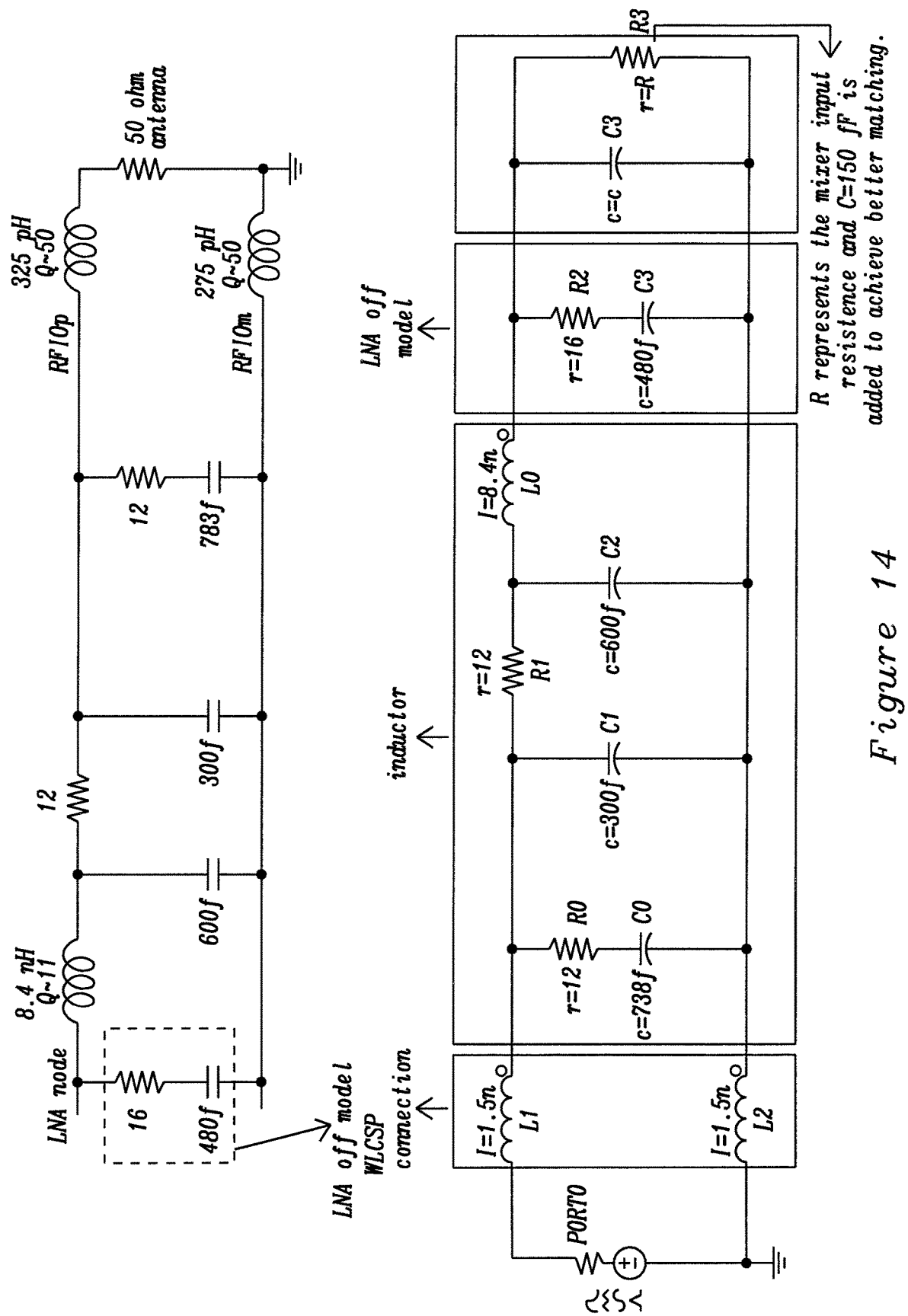
FIG. 14 is a schematic of a matching network for the mixer of FIG. 4B.

FIG. 13 is a schematic of a possible implementation of the mixer 412 for determining its input impedance using the nth harmonic. FIG. 14 is a schematic of a matching network for the mixer 412.

The mixer input resistance, considering $R_{IF}=\infty$ may be given as follows:

$$Z_{in(nth\ harmonic)} = \frac{R_{sw} + R_{sh,n}}{n^2} \quad (6)$$

$$R_{sh,n} = \frac{0.406(R_s + R_{sw})}{(n^2 - 0.406)} \quad (7)$$

Dividing by n in the above equation as we have n paths in parallel.

Using the equation (6) and (7), the size of mixer switches can be calculated for both with and without the matching network. With the matching network, the mixer ideally has an input impedance of 500 ohm, while it ideally has an input impedance of 50 ohm without the matching network.

Table below shows some primitive simulation results with input matching regarding using different harmonics.

|  | 1st | 3rd | 5th | nth |
|---|---|---|---|---|
| Mixer switch size | 2.5 um/20 nm | 500 nm/20 nm | 200 nm/20 nm | See FIG. 11 |
| Number of switches | 2 | 6 | 10 | 2n |
| Buffer size | 250 nm/20 nm | 80 nm/20 nm | 80 nm/20 nm | 80 nm/20 nm |
| Number of buffers | 2 | 6 | 10 | 2n |
| NF of the mixer (excluding other blocks) | 7.2 dB | 17.3 dB | 23.5 dB | — |
| Current per each buffer | 3.5 uA | 0.33 uA | 0.14 u | — |
| Number of edge-combiners | 0 | 3 | 5 | n |
| Current per each edge-combiner | — | 0.5 uA | 0.7 uA | — |
| Number of RO stages | 3 | 9 | 28 | $n^2$ |
| Number of gm-cells | 0 or 1 | 3 | 5 | n |
| Current per gm-cell | — | 0.5 uA | 0.5 uA | 0.5 uA |
| Current per TIA | 0.5 uA | 0.5 uA | 0.5 uA | 0.5 uA |
| RO frequency | 2.4 GHz | 267 MHz | 96 MHz | 2.4 GHz/$n^2$ |
| RO total current | 11 u | 4 u | 7.5 u | — |
| RO phase noise | −60 dBc/Hz | −62 dBc/Hz | −67 dBc/Hz | — |
| Total current | 18.5 uA | 9.5 uA | 15.4 uA | ** |

**Total current for nth harmonic = $RO_{current}$ + 2n * $buffer_{current}$ + n * $edge\text{-}combiner_{current}$ + n * $gm\text{-}cell_{current}$ + TIA Some important points:
Conversion gain is equal regardless of the used harmonic. Although conversion gain reduces by 1/n for the nth harmonic, we have n paths for our mixer that add together.
Power consumption of the buffers mainly depends on frequency and size of buffer. Using higher harmonics has the benefit of operating in lower frequency and having lower buffer size (as mixer switch size decreases). However, in a practical implementation of the technology, from $3^{rd}$ harmonic towards higher harmonics, the switch size becomes really low such that it can be driven with minimum buffer size (80 nm/20 nm). As a result, same buffer size is used from $3^{rd}$ harmonic and higher and power does not decrease notably in higher harmonics. But in higher technologies, it is possible that power will decrease in higher harmonics.
In a specific technology, VDD of ring oscillator cannot decrease more than a certain amount, as it should be able to oscillate at 2.4 GHz. However, with this idea, as the oscillator is operating in lower frequencies, VDD can further decrease.
Differential Ring Osc. can be used instead of having 2 buffers in series for generating the signals to drive the mixer switches. Using two buffer in series does not generate exact phase difference of 180 between LO signals while a differential RO does.
Other possible benefits are as follows:
First buffers can be deleted and the logic cell itself can be used as the first buffer.
Instead of using the adders or IF amplifier, we can short circuit the output of the 3 paths. In this case, the amplitude of the down-converted signal will be smaller but no extra power is required as no amplifier is needed. Initial simulations show that this structure works even when we short circuit the output of the 3 paths.
As it is a mixer-first receiver, when all switches are non-conducting, its input impedance is very high. This enables co-integration with a higher-performance receiver, e.g. a regular BLE receiver, by putting them in parallel. As a result, any input matching circuit may be shared, so that the performance of the idea presented here may be improved at no or extremely little additional cost. It thus enables reuse of existing hardware and ease of integration without or hardly any performance penalties.

The power consumption of 18 uW is achieved only by adjusting the size of the mixer switches without any input matching. By using a matching network, smaller switches can be used and power can be further reduced.

FIG. 15A is a schematic of an image frequency rejection circuit 1500 comprising the apparatus 400 in accordance with a fifth embodiment of the present disclosure. FIG. 15B is a schematic of an image frequency rejection circuit 1502 configured to enhance interference rejection and comprising the apparatus 400 in accordance with a sixth embodiment of the present disclosure. The circuits 1500, 1502 are for solving the image frequency problem. For each of these circuits 1500, 1502 we actually do not get rid of the image, we just define the LO frequency in a way that even the image frequency is wanted and needs to be detected.

In further embodiments of the circuits of FIGS. 15A and/or 15B, the apparatus 400 may alternatively be any of the other apparatuses as disclosed herein.

It will be appreciated that the apparatus 400 shown in FIG. 15A and FIG. 15 may include any of the features disclosed herein and in accordance with the understanding of the skilled person.

As the down-conversion using the proposed apparatuses discussed herein are extremely low power, it is possible to use multiple instances of the circuit as illustrated in FIGS. 15A and B. A method to eliminate the image frequency is to design the oscillator in a way that its frequency is right at the middle of the advertising channels as shown in FIGS. 15A and 15B. This idea can be extended to higher harmonics (e.g. using the 5th harmonic instead of the 3rd harmonic for reception).

FIGS. 15A and 15B may provide a receiver in which image rejection is achieved in baseband frequencies by appropriately combining multiple mixers at different RF-frequencies.

Sufficient image rejection in known systems is generally achieved either by external components such as BAW/SAW and FBAR filters, which are bulky and expensive and cannot be integrated, or by image-reject filtering which is somewhat power-hungry.

FIGS. 15A and 15B are schematics of circuits 1500, 1502 that put the LO frequency in the middle of desired channel by having fLO=fRF/n while fRF is exactly in the middle of two advertising channels. In this case, we have defined the LO frequency in a way that even the image frequency is wanted and needs to be monitored and detected.

An alternative embodiment may use the traditional method of I and Q signal (that have 90 degree phase differences). In this embodiment, each of the set of LO signals has a phase difference of 90° divided by n.

Figure 16:
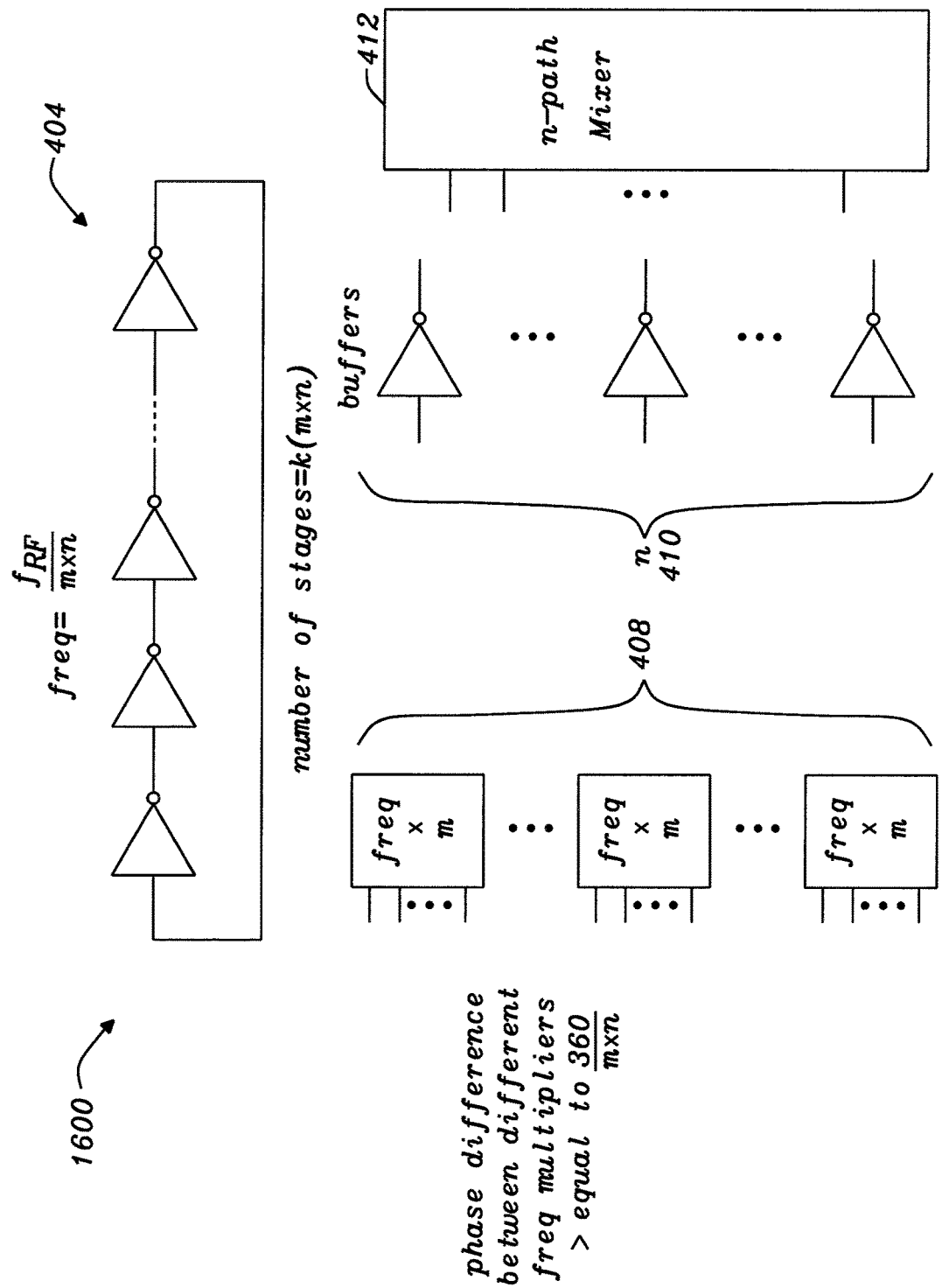
FIG. 16 is a schematic of an apparatus in accordance with a seventh embodiment of the present disclosure.

FIG. 16 is a schematic of an apparatus 1600 in accordance with a seventh embodiment of the present disclosure. The apparatus 1600 is an alternative implementation of the apparatus 400.

Figure 17:
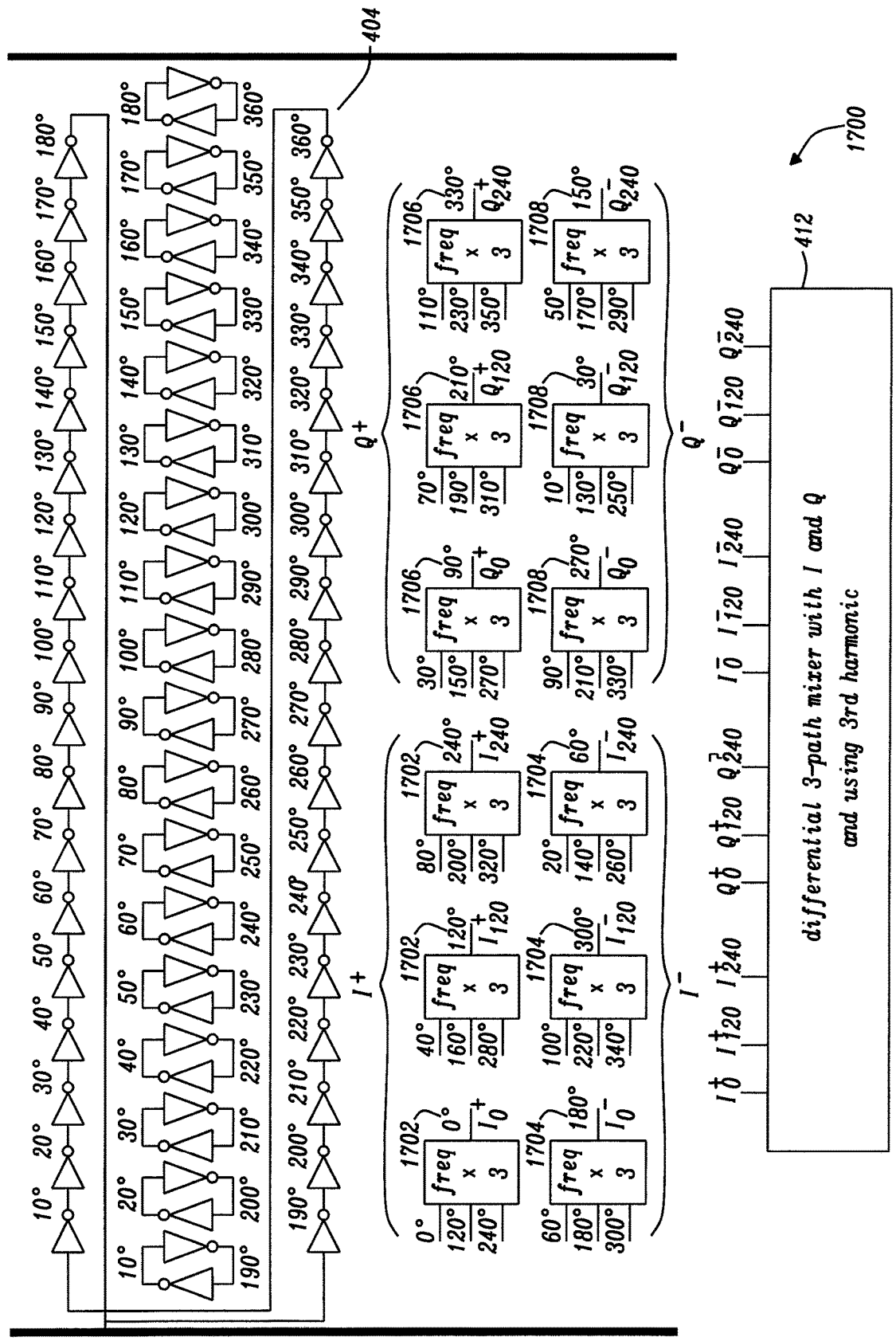
FIG. 17 is a schematic of an apparatus in accordance with an eighth embodiment of the present disclosure.

FIG. 17 is a schematic of an apparatus 1700 in accordance with an eighth embodiment of the present disclosure. The apparatus 1700 is an alternative implementation of the apparatus 400. Apparatus 1700 provides down conversion by multiplying frequency m=3, and the used of the third harmonic (n=3) with a different structure and I and Q.

It will be appreciated that the apparatus 1700, or a similar apparatus in accordance with the understanding of the skilled person, may provide the embodiment using the traditional method of I and Q signal for image rejection as discussed previously in relation to FIGS. 15A and 15B.

In the present embodiment the first set of LO signals is denoted by 1702. There is also provided a second set of LO signals 1704. Each of the second set of LO signals 1704 has a LO signal frequency equal to the first multiplication factor m multiplied by the oscillation frequency f0. Each of the second set of LO signals 1704 is separated by adjacent LO signals within the second set by a phase difference equal to 360° divided by n. Each of the second set of LO signals 1704 has a phase difference of 180° divided by n (in the present example 60°) when compared with a corresponding LO signal 1704 within the first set of LO signals 1702.

The LO 402 is also configured to generate a third set of LO signals 1708, wherein each of the third set of LO signals has a LO signal frequency equal to the first multiplication factor m multiplied by the oscillation frequency f0. Each of the third set of LO signals 1708 is separated by adjacent LO signals within the third set by a phase difference equal to 360° divided by n, and each of the third set of LO signals has a phase difference of 90° divided by n (in this example 30°) when compared with a corresponding LO signal within the second set of LO signals 1702.

The LO 402 is also configured to generate a fourth set of LO signals 1708, wherein each of the fourth set of LO signals has a LO signal frequency equal to the first multiplication factor m multiplied by the oscillation frequency. Each of the fourth set of LO signals 1708 is separated by adjacent LO signals within the fourth set by a phase difference equal to 360° divided by n, and each of the fourth set of LO signals has a phase difference of 90° divided by n when compared with a corresponding LO signal within the first set of LO signals.

In the present embodiment the mixer 412 is a differential mixer.

In the present embodiment, the ring oscillator comprises 4×k×n×m stages. Each inverter of each stage may be configured to generate a ring oscillator signal that is separated by the ring oscillator signals of adjacent stages by a phase difference equal to 360° divided by (4×m×n). k is an integer that is greater than or equal to one.

In the present example 4×1×3×3=36 stages are used and the LO 402 operates at fRF/(n×m)=fRF/9.

The previous embodiment uses quadrature (IQ) signals as will be well understood by the skilled person, and a differential mixer. In an alternative embodiment that does not use IQ signals, but uses a differential mixer, there may only be a first and second set of LO signals. In such an embodiment, the ring oscillator comprises 2×k×n×m stages. Each inverter of each stage may be configured to generate a ring oscillator signal that is separated by the ring oscillator signals of adjacent stages by a phase difference equal to 360° divided by (2×m×n).

With reference to all of the embodiments as described herein the duty cycle of each of the LO signals of the first and/or second and/or third and/or fourth set of LO signals may comprise the nth harmonic of the oscillation frequency in its Fourier Series. For example the duty cycle may be equal to 50% and n may be odd. Alternatively, the duty cycle may be equal to 25% and n may be even.

Figure 18B:
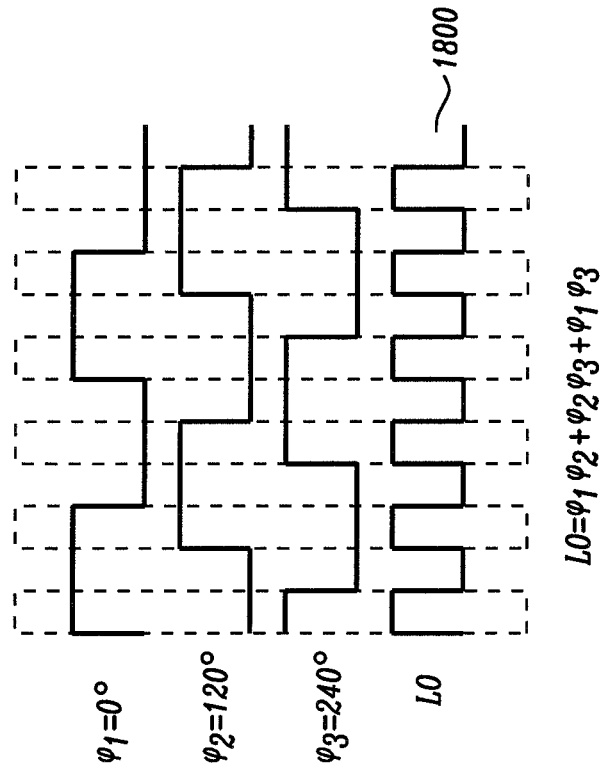
FIG. 18B is a graph showing how the three signals output from a ring oscillator varies with time, and how the output signal from one of the three logic cells varies with time.
Figure 18A:
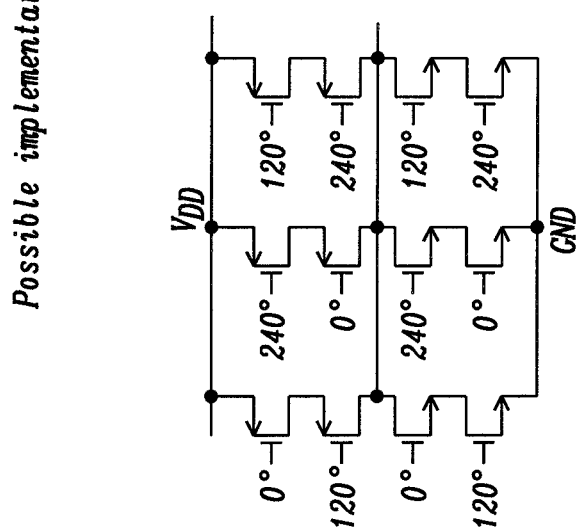
FIG. 18A is a schematic of a specific implementation of one of the logic cells comprising switches.

FIG. 18A is a schematic of a specific implementation of one of the logic cells comprising switches.

FIG. 18B is a graph showing how the three signals φ1, φ2 and φ3 output from a ring oscillator where n is equal to 3, varies with time, and how the output signal from one of the three logic cells varies with time. In the present example the duty cycle of each of the LO signals is 50%, illustrated for a single LO signal by a trace 1800.

Figure 19A:
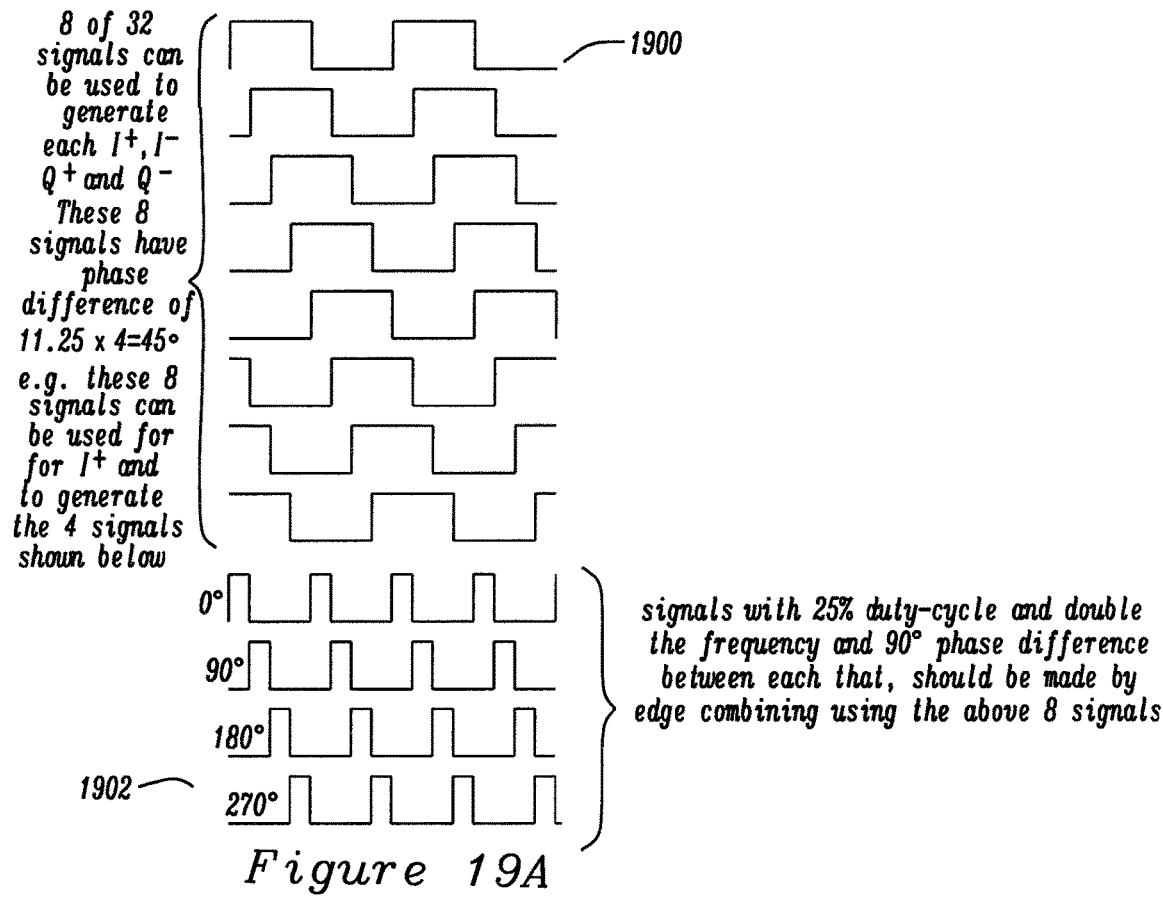
FIG. 19A is a graph showing the operation of an apparatus for down conversion using a differential mixer and IQ

FIG. 19A is a graph showing the operation of an apparatus for down conversion with m=2 and n=4 and using a differential mixer and IQ.

As the structure is differential I and Q are both needed, as a result at least 4×2×4=32 stages are required. This results in a phase difference between stages of 360°/32=11.25°.

As the fourth harmonic is chosen for the down conversion, 25% duty cycle is chosen as it contains the fourth harmonic.

Shown are 8 of the 32 signals (labelled 1900) generated by the ring oscillator. 8 of the 32 signals can be used to generate each I+, I−, Q+ and Q−. The phase difference of 180°/n=45° is between I+ and I− or Q+ and Q−. The phase difference between I+ and Q+ or I− and Q− is 90°/4=22.5° e.g. these 8 signals can be used for I+ and generate the 4 LO signals (labelled 1902). The LO signals have 25% duty-cycle and double the frequency, and 90° phase difference between each that can be generated by edge using the frequency multiplication circuit with the 8 signals (labelled 1900).

Figure 19B:
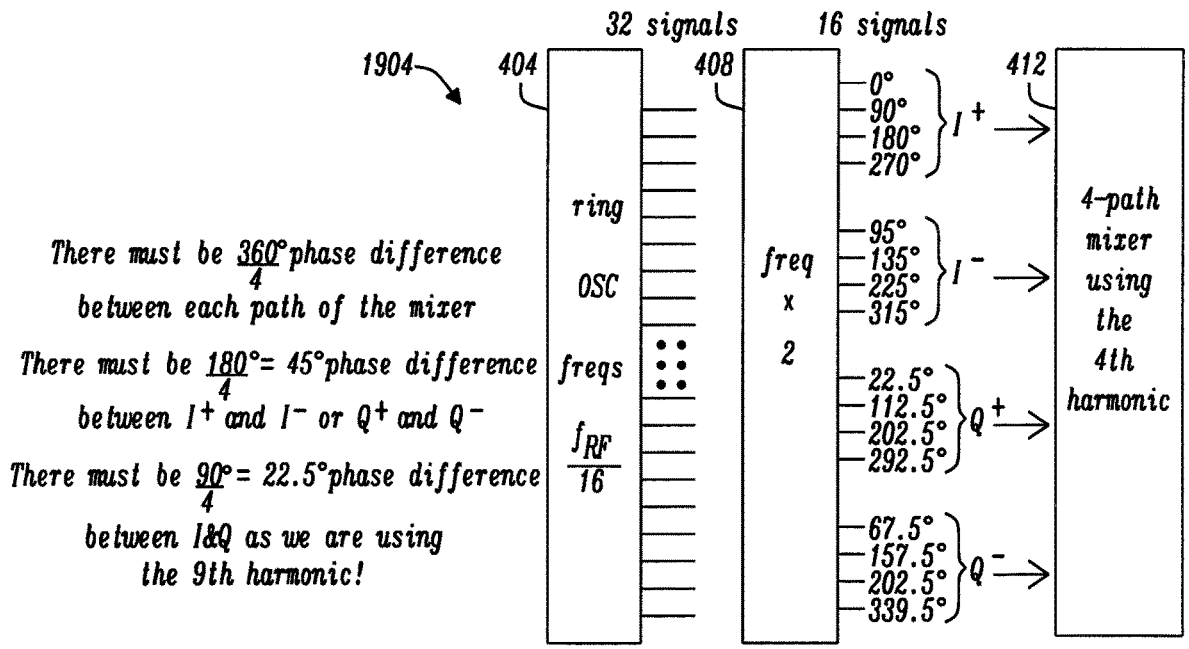
FIG. 19B is a schematic of an apparatus in accordance with an ninth embodiment of the present disclosure.

FIG. 19B is a schematic of an apparatus 1904 in accordance with an ninth embodiment of the present disclosure. The apparatus 1904 illustrates a specific embodiment of the apparatus 400 corresponding to the configuration as described in relation to FIG. 19A.

There is provided a 360°/4 phase difference between each path of the mixer 412. There is 180°/4=45° phase difference between I+ and I− or Q+ and Q−. There is a 90°/4=22.5° phase difference between I and Q as we are using the fourth harmonic.

Common features between Figures share common reference numerals and variables.

Various improvements and modifications may be made to the above without departing from the scope of the disclosure.

What is claimed is:

1. An apparatus comprising a local oscillator (LO) for driving a mixer, the LO being configured to:
   oscillate at an oscillation frequency; and
   generate a first set of LO signals; wherein:
   each of the first set of LO signals has a LO signal frequency equal to a first multiplication factor m multiplied by the oscillation frequency, the first multiplication factor m, being an integer greater than or equal to two; and
   each of the first set of LO signals is separated by adjacent LO signals by a phase difference equal to 360° divided by a first variable n, the first variable n being an integer that is greater than or equal to two; and wherein
   the LO comprises a plurality of frequency multiplication circuits for generating the first set of LO signals,
   whereby the apparatus further comprises a buffer circuit, the mixer configured to receive the first set of LO signals via the buffer circuit.

2. The apparatus of claim 1, wherein the LO comprises a ring oscillator oscillating at the oscillation frequency.

3. The apparatus of claim 2, wherein the ring oscillator comprises a plurality of stages equal to an integer k multiplied by the first variable n multiplied by the first multiplication factor m, where the integer k is greater than or equal to one.

4. The apparatus of claim 3, wherein each stage comprises an inverter comprising:
   an input coupled to an output of an inverter of the previous stage; and
   comprising an output coupled to an input of an inverter of the next stage.

5. The apparatus of claim 4, wherein each inverter of each stage is configured to generate a ring oscillator signal that is separated by the ring oscillator signals of adjacent stages by a phase difference equal to a fraction having a numerator of 360° and a denominator of n multiplied by m.

6. The apparatus of claim 5, wherein each frequency multiplication circuit is configured to receive a subset of the ring oscillator signals, where the subset of the ring oscillator signals are different from those received by each additional frequency multiplication circuit and the subset of ring oscillator signals are separated by adjacent ring oscillator signals within the subset by a phase difference equal to 360° divided by n.

7. The apparatus of claim 6, wherein each frequency multiplication circuit is configured to generate one of the first set of LO signals using the subset of the ring oscillator signals received by said frequency multiplication circuit.

8. The apparatus of claim 7, wherein each frequency multiplication circuit is configured to generate a LO signal in a high state when n+1/2 of the ring oscillator signals received by said frequency multiplication circuit are simultaneously in a high state, otherwise said frequency multiplication circuit is configured to generate a LO signal in a low state.

9. The apparatus of claim 1, wherein n is equal to three, such that each of the first set of LO signals is separated by adjacent LO signals by a phase difference equal to 120°.

10. The apparatus of claim 9, wherein the LO comprises a ring oscillator oscillating at the oscillation frequency and the ring oscillator comprises nine stages.

11. The apparatus of claim 1, comprising the mixer, wherein the mixer comprises at least n switches, wherein each LO signal is provided to one of the switches.

12. The apparatus of claim 1, wherein the LO is configured to generate a second set of LO signals, wherein each of the second set of LO signals has a LO signal frequency equal to the first multiplication factor m multiplied by the oscillation frequency, each of the second set of LO signals is separated by adjacent LO signals within the second set by a phase difference equal to 360° divided by the first variable n, and each of the second set of LO signals has a phase difference of 180° divided by the first variable n when compared with a corresponding LO signal within the first set of LO signals.

13. The apparatus of claim 12, wherein the mixer is a differential mixer.

14. The apparatus of claim 1, wherein the duty cycle of each of the LO signals of the first set of LO signals comprises the nth harmonic of the oscillation frequency in its Fourier Series.

15. The apparatus of claim 1 comprising an image frequency rejection circuit comprising the local oscillator and the mixer.

16. The apparatus of claim 15, wherein the image frequency rejection circuit comprises at least one additional local oscillator for driving an additional mixer, the additional LO being configured to operate at a second oscillation frequency and generate a first additional set of LO signals; wherein each of the first set of additional LO signals has a LO signal frequency equal to a second multiplication factor h multiplied by the second oscillation frequency, the second multiplication factor h being an integer greater than or equal to two; and each of the first set of additional LO signals is separated by adjacent LO signals by a phase difference equal to 360° divided by the first variable n.

17. The apparatus of claim 15, wherein the image frequency rejection circuit is configured to enhance interference rejection.

18. The apparatus of claim 15, wherein the apparatus is configured to down-convert or up-convert an RF signal with an n-th harmonic of the LO signal frequency, the first variable being equal to n, the RF signal being in the middle of two advertising channels.

19. The apparatus of claim 15, wherein, the LO is configured to:
   generate a second set of LO signals, wherein each of the second set of LO signals has a LO signal frequency equal to the first multiplication factor m multiplied by the oscillation frequency, each of the second set of LO signals is separated by adjacent LO signals within the second set by a phase difference equal to 360° divided by the first variable n, and each of the second set of LO signals has a phase difference of 180° divided by the first variable n when compared with a corresponding LO signal within the first set of LO signals;

generate a third set of LO signals, wherein each of the third set of LO signals has a LO signal frequency equal to the first multiplication factor multiplied by the oscillation frequency, each of the third set of LO signals is separated by adjacent LO signals within the third set by a phase difference equal to 360° divided by the first variable, and each of the third set of LO signals has a phase difference of 90° divided by the first variable when compared with a corresponding LO signal within the second set of LO signals; and generate a fourth set of LO signals, wherein each of the fourth set of LO signals has a LO signal frequency equal to of the first multiplication factor multiplied by the oscillation frequency, each of the fourth set of LO signals is separated by adjacent LO signals within the fourth set by a phase difference equal to 360° divided by the first variable, and each of the fourth set of LO signals has a phase difference of 90° divided by the first variable when compared with a corresponding LO signal within the first set of LO signals.

20. A method of operating an apparatus comprising a local oscillator (LO) for driving a mixer, the LO oscillates at an oscillation frequency, the method comprising generating a first set of LO signals using the LO, wherein each of the first set of LO signals has a LO signal frequency equal to a first multiplication factor m multiplied by the oscillation frequency, the first multiplication factor m being an integer greater than or equal to two, and each of the first set of LO signals is separated by adjacent LO signals by a phase difference equal to 360° divided by a first variable n, the first variable n being an integer that is greater than or equal to two; and wherein the LO comprises a plurality of frequency multiplication circuits for generating the first set of LO signals, the first set of LO signals being received by the mixer via a buffer circuit.

21. An apparatus comprising a local oscillator (LO) for driving a mixer, the LO being configured to:

oscillate at an oscillation frequency; and generate a first set of LO signals; wherein:

each of the first set of LO signals has a LO signal frequency equal to a first multiplication factor m multiplied by the oscillation frequency, the first multiplication factor m, being an integer greater than or equal to two; and each of the first set of LO signals is separated by adjacent LO signals by a phase difference equal to 360° divided by a first variable n, the first variable n being an integer that is greater than or equal to two; wherein the LO is configured to generate a second set of LO signals, wherein each of the second set of LO signals has a LO signal frequency equal to the first multiplication factor m multiplied by the oscillation frequency, each of the second set of LO signals is separated by adjacent LO signals within the second set by a phase difference equal to 360° divided by the first variable n, and each of the second set of LO signals has a phase difference of 180° divided by the first variable n when compared with a corresponding LO signal within the first set of LO signals, whereby the apparatus further comprises a buffer circuit, the mixer configured to receive the first set of LO signals and the second set of LO signals via the buffer circuit.

22. The apparatus of claim 21, wherein the mixer is a differential mixer.

* * * * *

UNITED STATES PATENT AND TRADEMARK OFFICE
CERTIFICATE OF CORRECTION

PATENT NO. : 12,323,102 B2
APPLICATION NO. : 17/980847
DATED : June 3, 2025
INVENTOR(S) : Maryam Dodangeh, Mark Oude Alink and Bram Nauta Page 1 of 1

It is certified that error appears in the above-identified patent and that said Letters Patent is hereby corrected as shown below:

In the Claims

In Column 22, Line 3, please replace "n+1/2" with "(n+1)/2".

Signed and Sealed this
Sixteenth Day of September, 2025

Coke Morgan Stewart
*Acting Director of the United States Patent and Trademark Office*